(12) United States Patent
Taniguchi

(10) Patent No.: US 9,972,508 B2
(45) Date of Patent: May 15, 2018

(54) MANUFACTURING METHOD OF SEMICONDUCTOR DEVICE

(71) Applicant: Renesas Electronics Corporation, Tokyo (JP)

(72) Inventor: Kei Taniguchi, Tokyo (JP)

(73) Assignee: RENESAS ELECTRONIC CORPORATION, Tokyo (JP)

( * ) Notice: Subject to any disclaimer, the term of this patent is extended or adjusted under 35 U.S.C. 154(b) by 0 days. days.

(21) Appl. No.: 15/548,077

(22) PCT Filed: Jun. 24, 2015

(86) PCT No.: PCT/JP2015/068179
§ 371 (c)(1),
(2) Date: Aug. 1, 2017

(87) PCT Pub. No.: WO2016/207999
PCT Pub. Date: Dec. 29, 2016

(65) Prior Publication Data
US 2018/0033649 A1 Feb. 1, 2018

(51) Int. Cl.
*H01L 21/00* (2006.01)
*H01L 21/56* (2006.01)
*H01L 23/00* (2006.01)

(52) U.S. Cl.
CPC .............. *H01L 21/56* (2013.01); *H01L 24/06* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/04042* (2013.01); *H01L 2224/06135* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2224/92247* (2013.01)

(58) Field of Classification Search
None
See application file for complete search history.

(56) References Cited

U.S. PATENT DOCUMENTS 9,018,745 B2 * 4/2015 Shimizu .................. H01L 24/97
257/676
2014/0001620 A1 1/2014 Shimizu et al.

FOREIGN PATENT DOCUMENTS

| JP | 2000-196006 A | 7/2000 |
| JP | 2008-147370 A | 6/2008 |
| JP | 2011-091145 A | 5/2011 |

(Continued)

OTHER PUBLICATIONS

International Search Report (ISR) (PCT Form PCT/ISA/210), in PCT/JP2015/068179, dated Sep. 8, 2015.

*Primary Examiner* — Jack Chen
(74) *Attorney, Agent, or Firm* — McGinn IP Law Group, PLLC

(57) ABSTRACT

The reliability of a semiconductor device is improved. In a manufacturing method of a semiconductor device, when resin enters a ditch formed on a lower surface of a chip mounting portion by a process of forming a sealing body made of the resin, the resin embedded in the ditch is removed by a process of cleaning the lower surface of the chip mounting portion, and a plating film is formed also on an inner wall of the ditch in a process of forming the plating film on the lower surface of the chip mounting portion.

15 Claims, 25 Drawing Sheets

(56) References Cited

FOREIGN PATENT DOCUMENTS

| JP | 2012-094598 A | 5/2012 |
| JP | 2013-258348 A | 12/2013 |
| JP | 2014-007363 A | 1/2014 |

* cited by examiner

FIG. 4
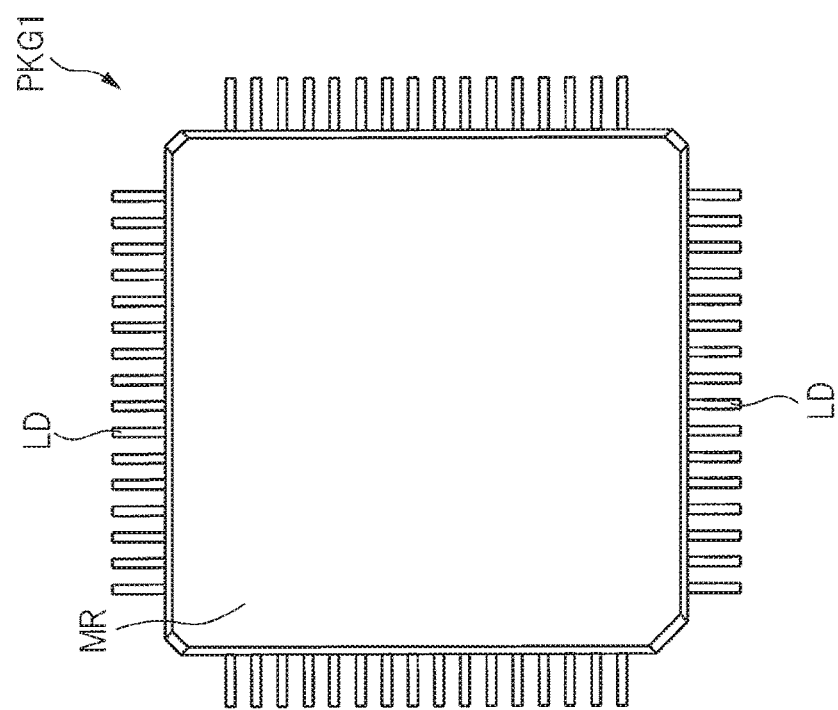
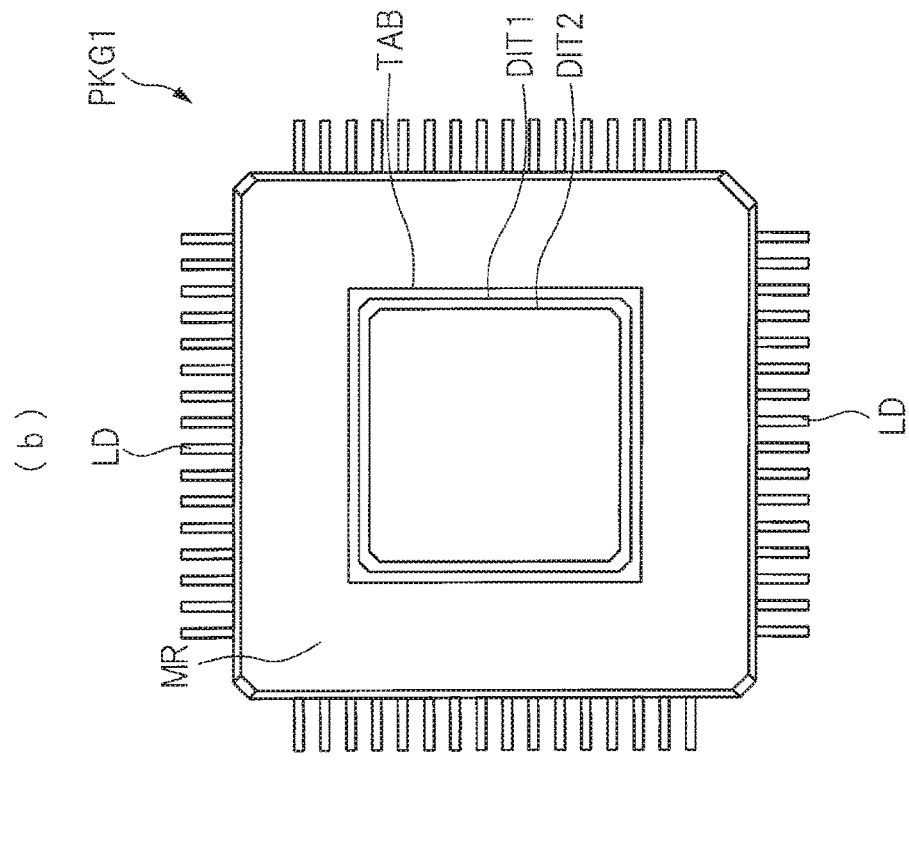

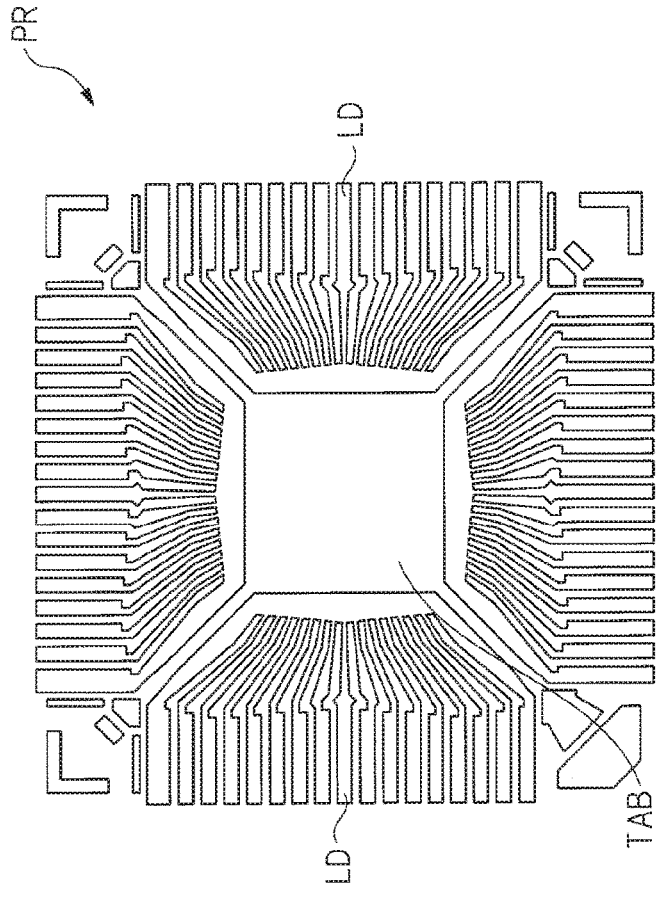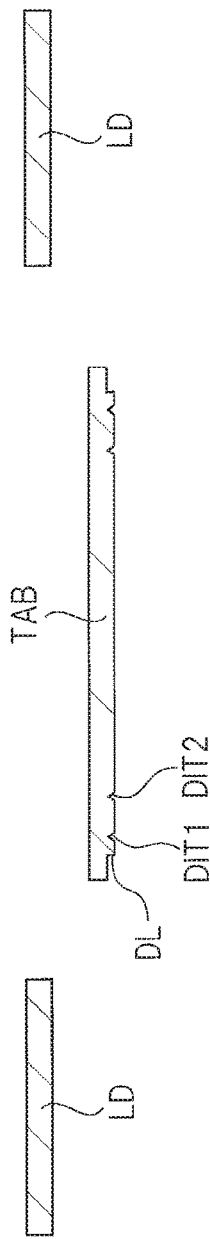
FIG. 12

FIG. 13
(a)
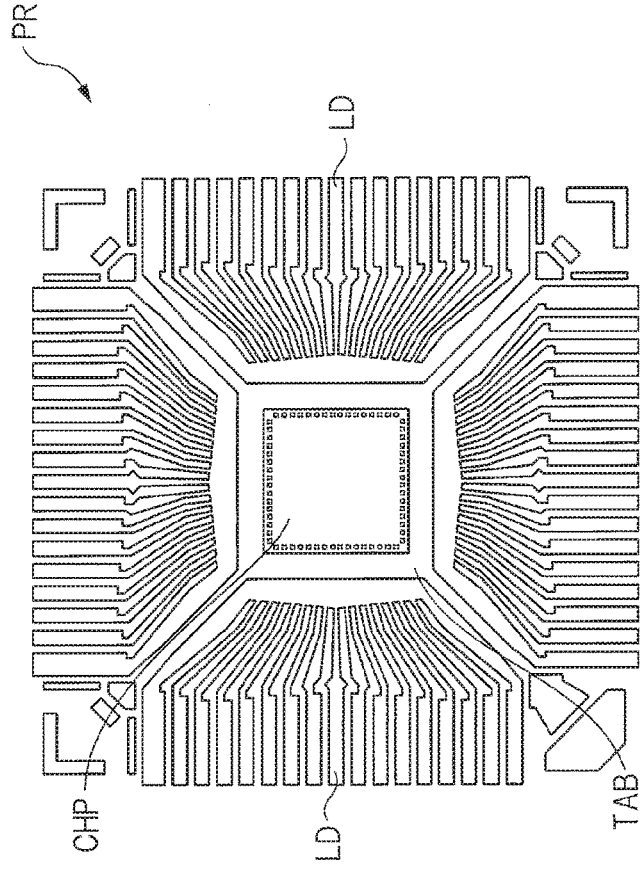
(b)
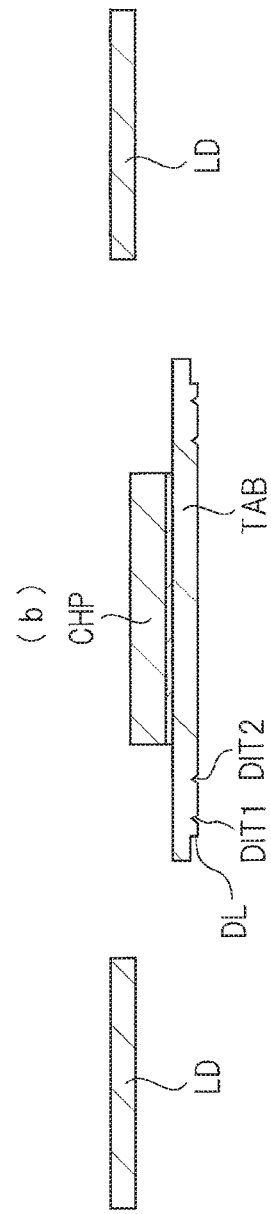

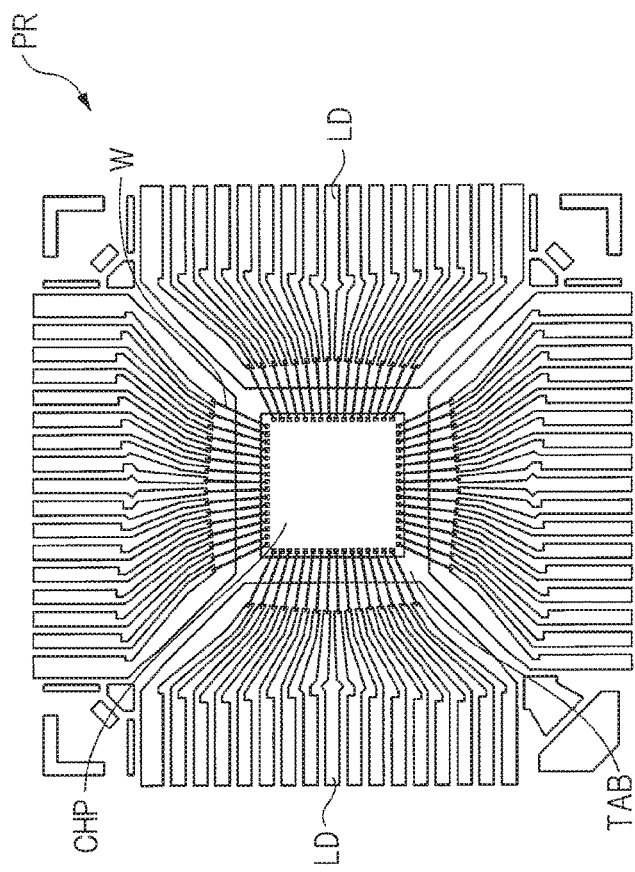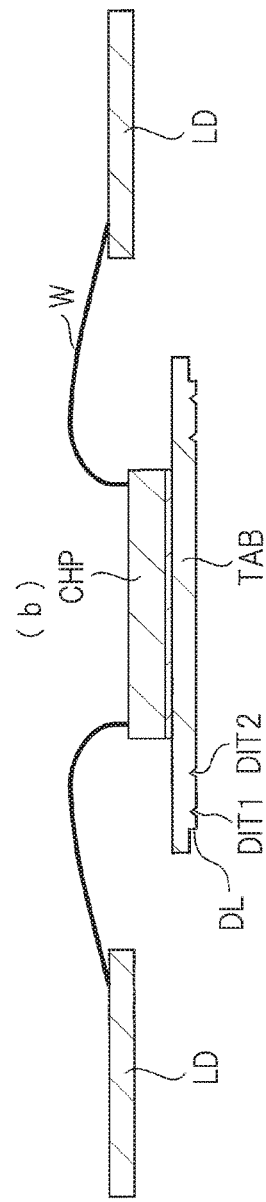
FIG. 14 (a) (b)

FIG. 23
(a)
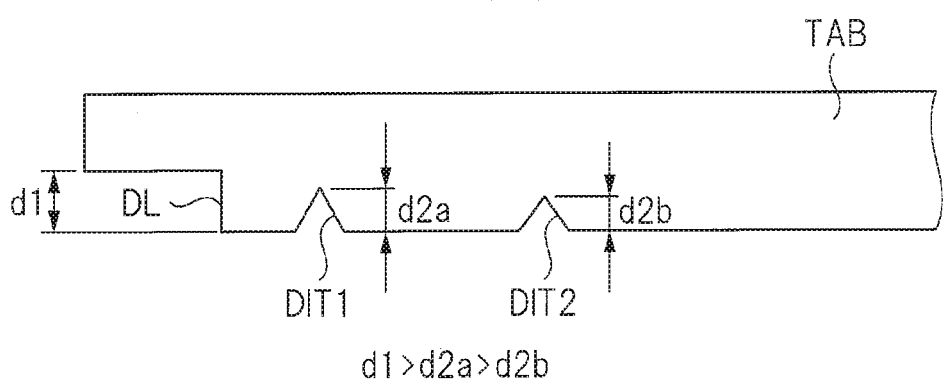
d1>d2a>d2b
(b)
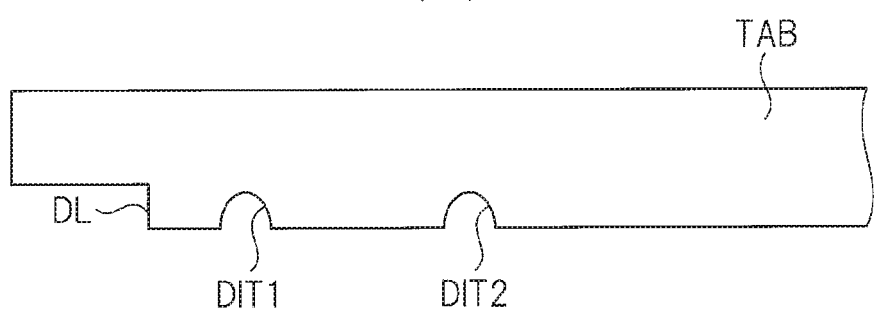

MANUFACTURING METHOD OF SEMICONDUCTOR DEVICE

TECHNICAL FIELD

The present invention relates to a manufacturing technique of a semiconductor device, for example, a technique effectively applied to a manufacturing method of a semiconductor device having a structure in which a lower surface of a chip mounting portion is exposed from a sealing body.

BACKGROUND ART

Japanese Unexamined Patent Application Publication No. 2014-7363 (Patent Document 1) describes a technique of forming a single ditch on a lower surface of a die pad exposed from a sealing body.

Japanese Unexamined Patent Application Publication No. 2012-94598 (Patent Document 2) describes a technique of removing resin burrs formed on a die pad exposed from a sealing body.

RELATED ART DOCUMENTS

Patent Documents

Patent Document 1: Japanese Unexamined Patent Application Publication No. 2014-7363
Patent Document 2: Japanese Unexamined Patent Application Publication No. 2012-94598

SUMMARY OF THE INVENTION

Problems to be Solved by the Invention

As a package configuration of a semiconductor device, there is a tab exposure type semiconductor device in which a lower surface of a chip mounting portion (die pad, tab) on which a semiconductor chip is mounted is exposed from a sealing body. This tab exposure type semiconductor device has the advantage that heat generated in the semiconductor chip can be efficiently radiated from the lower surface of the die pad exposed from the sealing body.

However, the manufacturing process of the tab exposure type semiconductor device includes a process of forming the sealing body while exposing the lower surface of the chip mounting portion, and the resin constituting the sealing body inevitably leaks out on the lower surface of the chip mounting portion in the actual process of forming the sealing body. When this resin leakage increases, the region covered with the resin in the lower surface of the chip mounting portion becomes larger, and there is a possibility that the heat radiation efficiency from the exposed chip mounting portion decreases. Namely, even if the chip mounting portion is designed so that the lower surface thereof is exposed, since the resin leakage inevitably occurs in the actual manufacturing process, how the resin leakage onto the lower surface of the chip mounting portion can be suppressed becomes important from the viewpoint of improving the heat radiation efficiency of the semiconductor device. In other words, in order to manufacture a semiconductor device in which the lower surface of the chip mounting portion is exposed to improve heat radiation efficiency, it is necessary to suppress the increase in the resin leakage that inevitably occurs in the actual manufacturing process.

Other problems and novel features will become apparent from the description of this specification and the accompanying drawings.

Means for Solving the Problems

In a manufacturing method of a semiconductor device in one embodiment, when resin enters a first ditch formed on a lower surface of a chip mounting portion by a process of forming a sealing body made of the resin, the resin embedded in the first ditch is removed by a process of cleaning the lower surface of the chip mounting portion, and a plating film is formed also on an inner wall of the first ditch in a process of forming the plating film on the lower surface of the chip mounting portion.

Effects of the Invention

According to one embodiment, the reliability of the semiconductor device can be improved.

BRIEF DESCRIPTIONS OF THE DRAWINGS

FIG. 4(a) is a plan view of a semiconductor device in an embodiment viewed from the upper surface side, and FIG. 4(b) is a plan view of the semiconductor device in the embodiment viewed from the bottom;

FIG. 12(a) is a plan view and FIG. 12(b) is a cross-sectional view each showing the manufacturing process of the semiconductor device continued from FIG. 11;

FIG. 13(a) is a plan view and FIG. 13(b) is a cross-sectional view each showing the manufacturing process of the semiconductor device continued from FIG. 12;

FIG. 14(a) is a plan view and FIG. 14(b) is a cross-sectional view each showing the manufacturing process of the semiconductor device continued from FIG. 13;

FIG. 23(a) is a schematic diagram showing a first modification example, and FIG. 23(b) is a schematic diagram showing a second modification example;

DETAILED DESCRIPTION OF PREFERRED EMBODIMENTS

Figure 1:
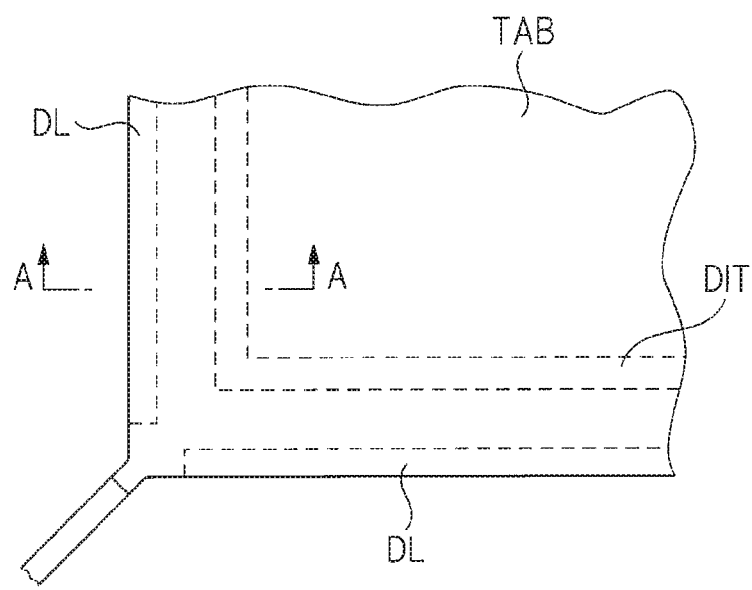
FIG. 1 is a plan view of a chip mounting portion in a related technique viewed from the upper surface side.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference characters throughout the drawings for describing the embodiments, and the repetitive description thereof is omitted. In addition, hatching is used even in a plan view so as to make the drawings easy to see.

Description of Related Technique

First, the related technique of the tab exposure type semiconductor device will be described, and then improvements for the related technique will be studied. Thereafter, the technical idea made by the study of improvements for the related technique will be described. It should be noted that "related technique" referred to in this specification is a technique having a problem newly discovered by the inventor and is not a publicly known conventional technique, but is a technique described with the intention for a prerequisite technique (unknown technique) of a novel technical idea.

A lead frame including a chip mounting portion and a lead is made of, for example, a copper material to be easily oxidized, and adhesion decreases in the oxidized copper material. Therefore, in the tab exposure type semiconductor device, in order to improve connection reliability when the semiconductor device is mounted on the mounting board, a plating film that covers the exposed lower surface of the chip mounting portion is formed and the chip mounting portion is mounted on the metal pattern (terminal) on the mounting board through this plating film. At this time, there are the case where the plating film to be formed on the lower surface of the chip mounting portion is formed on a lead frame in advance and the case where the plating film is formed in the manufacturing process of the semiconductor device.

In recent years, the plating film used for the semiconductor device has been required to be lead-free from the viewpoint of environmental consideration. As the lead-free measures, in the related technique, for example, a plating film comprised of a laminated film of Ni (nickel)/Pd (palladium)/Au (gold) is used, and the Ni/Pd/Au film is formed on the lead frame in advance.

Here, in the tab exposure type semiconductor device, the resin constituting the sealing body inevitably leaks onto the lower surface of the chip mounting portion in the sealing process. Therefore, in the tab exposure type semiconductor device, it is conceivable that a cleaning process for removing the resin leaked onto the lower surface of the chip mounting portion is performed after the sealing process. However, in the related technique, the cleaning process for removing the resin leaked onto the lower surface of the chip mounting portion is not performed. This is because when the cleaning process is performed in the related technique, nickel constituting the Ni/Pd/Au film piles up on the lower surface of the chip mounting portion. In other words, this is because when nickel piles up on the lower surface of the chip mounting portion, this nickel is easily oxidized, and thus the connection reliability between the chip mounting portion and the mounting board is lowered.

In other words, the Ni/Pd/Au film has a function of improving the connection reliability between the chip mounting portion and the mounting board by covering the chip mounting portion made of an easily oxidized copper material. However, if the cleaning process for removing the resin leaked onto the lower surface of the chip mounting portion is performed, nickel piles up on the outermost surface of the Ni/Pd/Au film, and since this nickel is easily oxidized, even if the Ni/Pd/Au film is formed on the lower surface of the chip mounting portion, the connection reliability between the chip mounting portion and the mounting board cannot be improved. Namely, if the cleaning process for removing the resin leaked onto the lower surface of the chip mounting portion is performed in the related technique, the function of the Ni/Pd/Au film for improving the connection reliability disappears.

Therefore, it is difficult to perform the cleaning process in the related technique from the viewpoint of improving the connection reliability between the tab exposure type semiconductor device and the mounting board. On the other hand, since the resin constituting the sealing body inevitably leaks onto the lower surface of the chip mounting portion in the sealing process, it is necessary to reduce the amount of resin leaked onto the lower surface of the chip mounting portion as much as possible in the related technique.

Specifically, FIG. 1 is a plan view of a chip mounting portion TAB in a related technique viewed from the upper surface side. In FIG. 1, a step portion DL is formed at the end of the chip mounting portion TAB, and a ditch DIT is formed along the outer peripheral portion of the chip mounting portion TAB. Here, since the step portion DL and the ditch DIT are formed on the lower surface of the chip mounting portion TAB, they are indicated by broken lines in FIG. 1.

Figure 2:
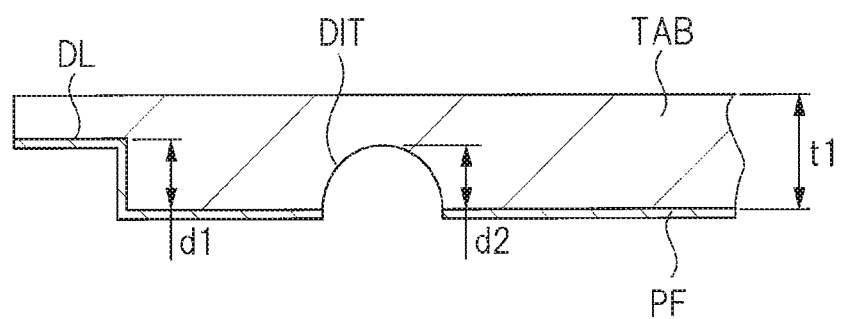
FIG. 2 is a cross-sectional view taken along line A-A of FIG. 1.

FIG. 2 is a cross-sectional view taken along line A-A of FIG. 1. As shown in FIG. 2, the step portion DL is formed at the end of the lower surface of the chip mounting portion TAB, and a single ditch DIT is formed on the inner side so as to be spaced apart from this step portion DL. Here, the thickness t1 of the chip mounting portion TAB, the difference in level d1 of the step portion DL, and the depth d2 of the ditch DIT are shown in FIG. 2.

Figure 3:
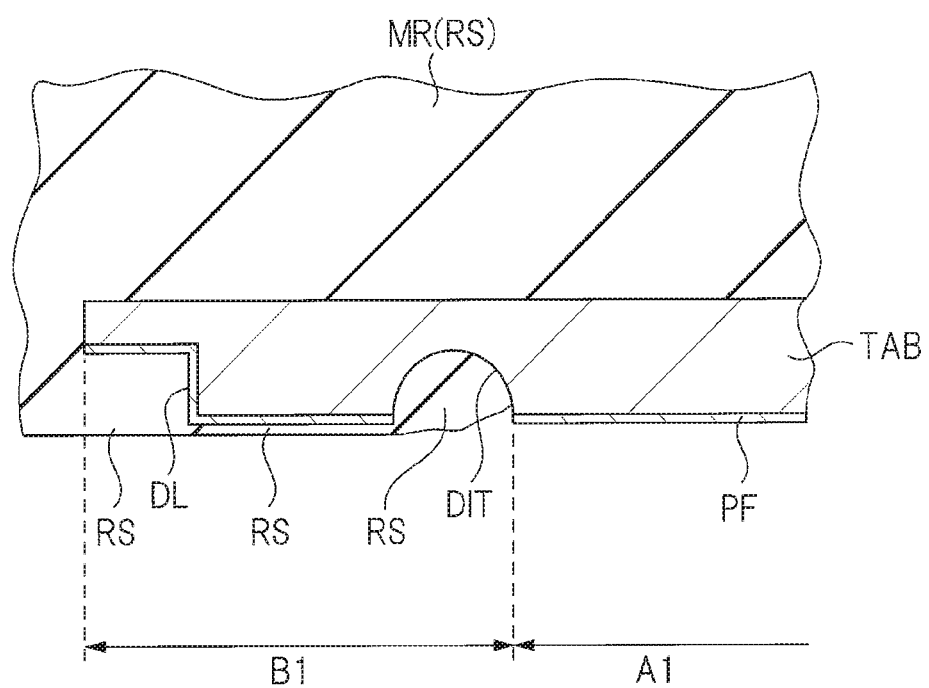
FIG. 3 is a schematic cross-sectional view showing a state in which a sealing body is formed by performing a sealing process with resin on the chip mounting portion in the related technique shown in FIG. 2.

FIG. 3 is a schematic cross-sectional view showing a state in which a sealing body MR is formed by performing a sealing process with the resin RS on the chip mounting portion TAB in the related technique shown in FIG. 2. In FIG. 3, although the step portion DL is provided for suppressing the spread of resin leakage on the lower surface of the chip mounting portion TAB, it is difficult to completely suppress the spread of resin leakage only with the step portion DL. Therefore, in the related technique, the ditch DIT is provided on the inner side so as to be spaced apart from the step portion DL. Thus, the resin RS leaked onto the lower surface of the chip mounting portion TAB enters the inside of the ditch DIT and is stopped. In this manner, according to the related technique, the spread of resin leakage to the region on the inner side of the ditch DIT can be suppressed. In other words, in the related technique, the spread of resin RS leaked onto the lower surface of the chip mounting portion TAB is suppressed by providing the step portion DL and the ditch DIT. Accordingly, the ditch DIT provided in the related technique has a function of suppressing the spread of resin leakage to the region on the inner side of the ditch DIT by causing the resin RS to enter the inside as much as possible. In other words, the basic idea of providing the ditch DIT in the related technique is to deepen the depth of the ditch DIT as much as possible to improve the function of stopping the spread of the resin RS with the ditch DIT. Namely, since the related technique is not based on the premise that the resin RS leaked onto the lower surface of the chip mounting portion TAB is removed, it naturally does not assume to remove the resin RS entering the inside of the ditch DIT. Therefore, in the related technique, the main focus is placed on improving the function of stopping the spread of the resin RS with the ditch DIT by increasing the depth of the ditch DIT as much as possible without considering the ease of removing the resin RS embedded in the ditch DIT. Accordingly, in the related technique, in order to enhance the function of stopping the spread of the resin RS with the ditch DIT, for example, the depth d2 of the ditch DIT is set to ½ or more of the thickness t1 of the chip mounting portion TAB as shown in FIG. 2. In addition, in the related technique, the difference in level d1 of the step portion DL is set to ½ or more of the thickness t1 of the chip mounting portion TAB.

In the related technique thus configured, as shown in FIG. 3, the plating film PF is exposed in the region A1 of the lower surface of the chip mounting portion TAB, whereas the area B1 of the lower surface of the chip mounting portion TAB is covered with the resin RS leaked onto the lower surface of the chip mounting portion TAB. As a result, in the related technique, since the heat radiation characteristics in the region B1 covered with the resin RS deteriorate and the region B1 cannot be used for connection with the mounting board, the connection reliability between the chip mounting portion TAB and the mounting board also decreases. Namely, there is room for improvement in the related technique from the viewpoint of improving the heat radiation characteristics of the semiconductor device and improving the connection reliability.

Thus, devises for overcoming the room for improvement existing in the related technique are made in the present embodiment. Hereinafter, the devised technical idea in the present embodiment will be described.

<Basic Idea in Embodiment>

In the basic idea in the present embodiment, on the premise that a ditch for suppressing the spread of resin leakage is provided on the lower surface of the chip mounting portion in the tab exposure type semiconductor device, a cleaning process for removing the resin entering the inside of the ditch together with the resin leaked onto the lower surface of the chip mounting portion is performed after the sealing process with the resin, and a plating film is formed also inside the ditch after the cleaning process.

Namely, according to the basic idea of the present embodiment, while suppressing the spread of resin leakage with the ditch, the resin entering the inside of the ditch is removed, and a plating film is formed on the inner wall of the ditch. Thus, according to the basic idea in the present embodiment, the improvement in the heat radiation characteristics of the semiconductor device by removing the resin from the lower surface of the chip mounting portion including the inside of the ditch and the improvement in the connection reliability between the semiconductor device and the mounting board by forming a plating film also on the inner wall of the ditch can be achieved.

The basic idea in the present embodiment is common to the related technique in that the ditch is provided on the lower surface of the chip mounting portion, but is different from the related technique in that the ditch provided in the present embodiment is based on the premise that the resin entering the inside of the ditch is removed, whereas the ditch provided in the related technique is not based on the premise that the resin entering the inside of the ditch is removed. In other words, the ditch in the present embodiment and the ditch provided in the related technique are common in that both of the ditches have a function of suppressing the spread of resin leakage on the lower surface of the chip mounting portion. However, since the design concept of the ditch provided in the related technique is not based on the premise that the resin entering the inside of the ditch is removed, the design concept has a basic idea specialized for increasing the internal volume of the ditch as much as possible to improve the effect of stopping the spread of the resin leakage. On the other hand, since the design concept of the ditch provided in the present embodiment is based on a premise that the resin entering the inside of the ditch is removed, the design concept has a basic idea in consideration of not only the function of stopping the spread of the resin leakage by the ditch but also the ease of removal of the resin entering the inside of the ditch. Thus, since the basic idea in the present embodiment is different in the orientation (viewpoint) from the basic idea in the related technique, the configuration of the semiconductor device embodying the basic idea in the present embodiment is different from the configuration of the semiconductor device in the related technique. In other words, the lower surface configuration of the chip mounting portion in the present embodiment is different from the lower surface configuration of the chip mounting portion in the related technique.

<Configuration of Semiconductor Device>

In the following, the configuration of the semiconductor device in the present embodiment will be described.

FIGS. 4(a) and 4(b) are plan views each showing the configuration of the semiconductor device PKG1 in the present embodiment. In particular, FIG. 4(a) is a plan view of the semiconductor device PKG1 in the present embodiment viewed from the upper surface side (front side), and FIG. 4(b) is a plan view of the semiconductor device PKG1 in the present embodiment viewed from the lower surface side (back side). In FIG. 4(a), the semiconductor device PKG1 in the present embodiment includes, for example, a sealing body MR having a rectangular shape, and a plurality of leads LD protrude from four sides of the sealing body MR. On the other hand, in FIG. 4(b), in the semiconductor device PKG1 in the present embodiment, the lower surface of the chip mounting portion TAB is exposed from the sealing body MR, and double ditches DIT1 and DIT2 are formed along the outer peripheral portion of the chip mounting portion TAB in the exposed chip mounting portion TAB. As described above, the semiconductor device PKG1 in the present embodiment constitutes a so-called tab exposure type semiconductor device, in which the lower surface of the chip mounting portion TAB is exposed from the sealing body MR, and in particular, the package structure of the semiconductor device PKG1 in the present embodiment is a Quad Flat Package (QFP).

Figure 5:
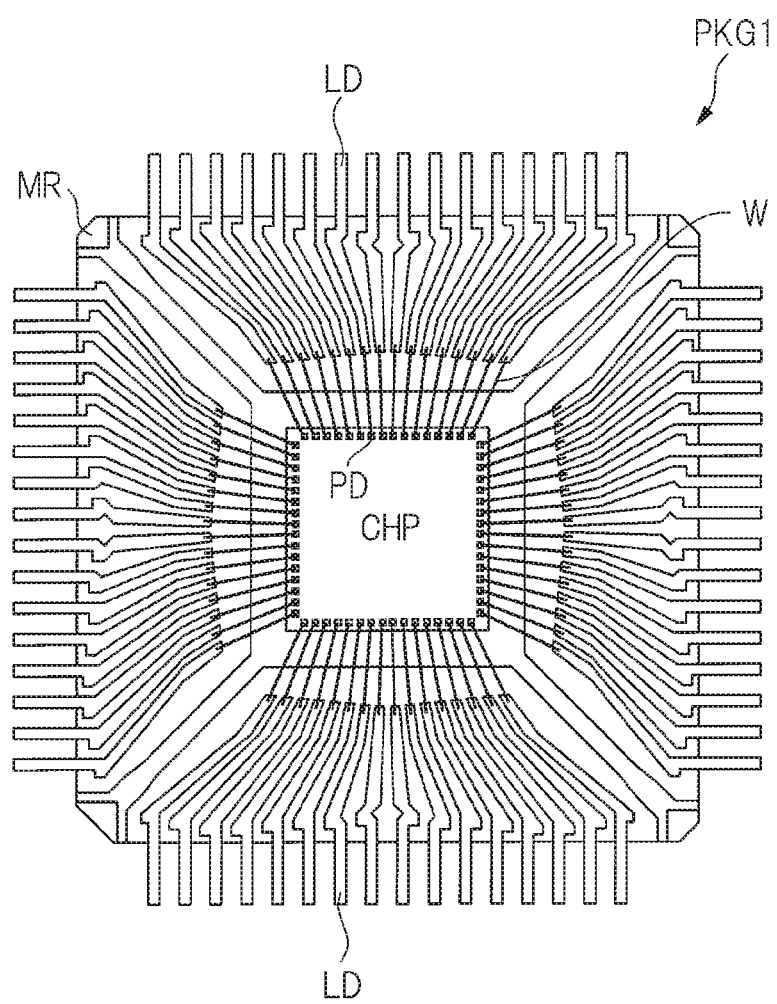
FIG. 5 is a plan view showing an inside of a sealing body seen through the sealing body in the semiconductor device of the embodiment.

Next, FIG. 5 is a plan view showing an inside of the sealing body MR seen through the sealing body in the semiconductor device PKG1 of the present embodiment. As shown in FIG. 5, the rectangular-shaped chip mounting portion TAB is arranged in the central part of the inside of the sealing body MR, and the rectangular-shaped semiconductor chip CHP is mounted on the upper surface of the chip mounting portion TAB. For example, an integrated circuit is formed in the semiconductor chip CHP, the integrated circuit includes a plurality of field effect transistors formed on a semiconductor substrate and multilayer wiring formed above the field effect transistors, and a plurality of pads PD shown in FIG. 5 are formed in the uppermost layer of the multilayer wiring. For example, the plurality of pads PD are arranged along the outer peripheral portion of the rectangular-shaped semiconductor chip CHP, and the pad PD formed on the semiconductor chip CHP and the lead LD are electrically connected by, for example, a wire made of gold wire (conductive member) W.

Figure 6:
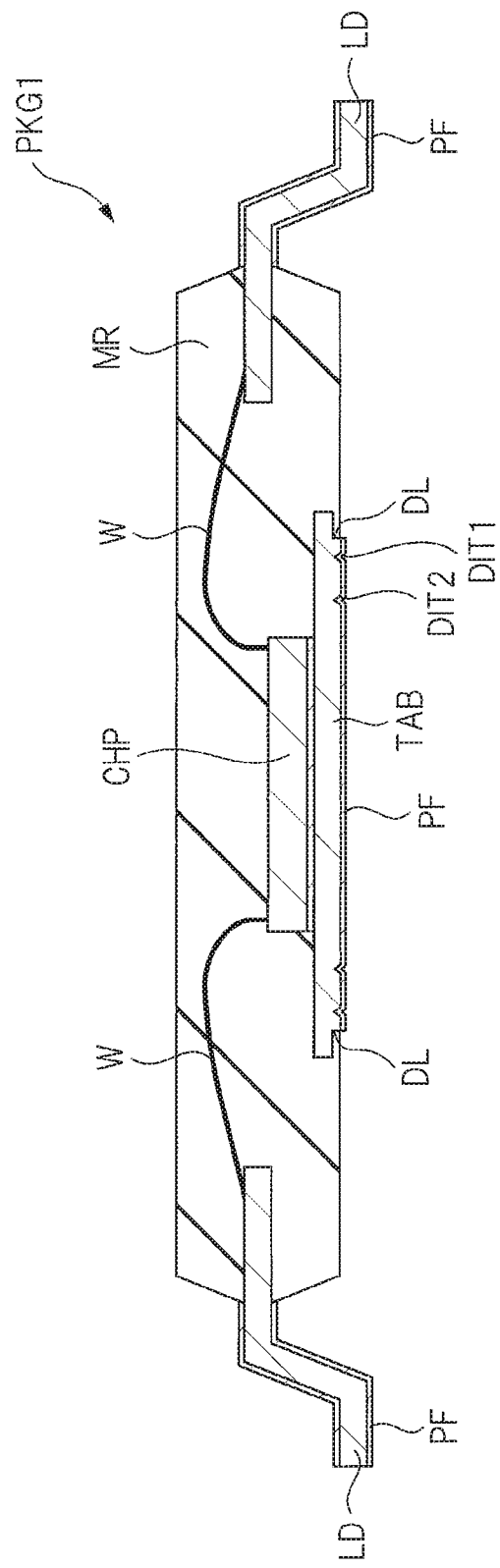
FIG. 6 is a cross-sectional view of the semiconductor device in the embodiment taken along one section.

Subsequently, FIG. 6 is a cross-sectional view of the semiconductor device PKG1 in the present embodiment taken along a section. As shown in FIG. 6, the semiconductor device PKG1 in the present embodiment includes the sealing body MR made of, for example, resin and the lower surface of the chip mounting portion TAB is exposed from the sealing body MR. Further, the semiconductor chip CHP is mounted on the upper surface of the chip mounting portion TAB, and the pad formed on the surface of the semiconductor chip CHP (not shown in FIG. 6) and the lead LD are connected by the wire W. Here, in the present embodiment, on the lower surface of the chip mounting portion TAB exposed from the sealing body MR, the step portion DL is formed at the outer edge (outer end), the ditch DIT1 is formed on the inner side of the step portion DL, and the ditch DIT2 is formed on the inner side of the ditch DIT1. In this case, in the semiconductor device PKG1 in the present embodiment, the resin constituting the sealing body MR is embedded in the step portion DL, while no resin is formed inside the ditch DIT1 and the ditch DIT2.

Figure 7:
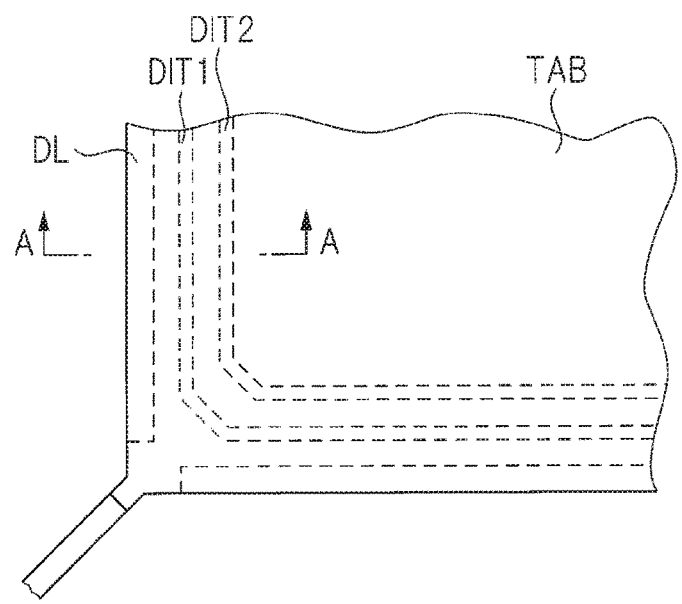
FIG. 7 is a partially enlarged view of a vicinity of a corner portion of the chip mounting portion viewed from the upper surface side.

FIG. 7 is a partially enlarged view of the vicinity of a corner portion of the chip mounting portion TAB viewed from the upper surface side. In FIG. 7, it can be seen that the step portion DL is formed on the lower surface of the chip mounting portion TAB, the ditch DIT1 is formed on the inner side of this step portion DL, and the ditch DIT2 is formed on the inner side of the ditch DIT1. Further, as shown in FIG. 7, the ditch DIT1 and the ditch DIT2 are formed along the outer peripheral portion of the chip mounting portion TAB, and in particular, the ditch DIT1 and the ditch DIT2 are formed in a tapered shape in the vicinity of the corner portion of the chip mounting portion TAB.

Figure 8:
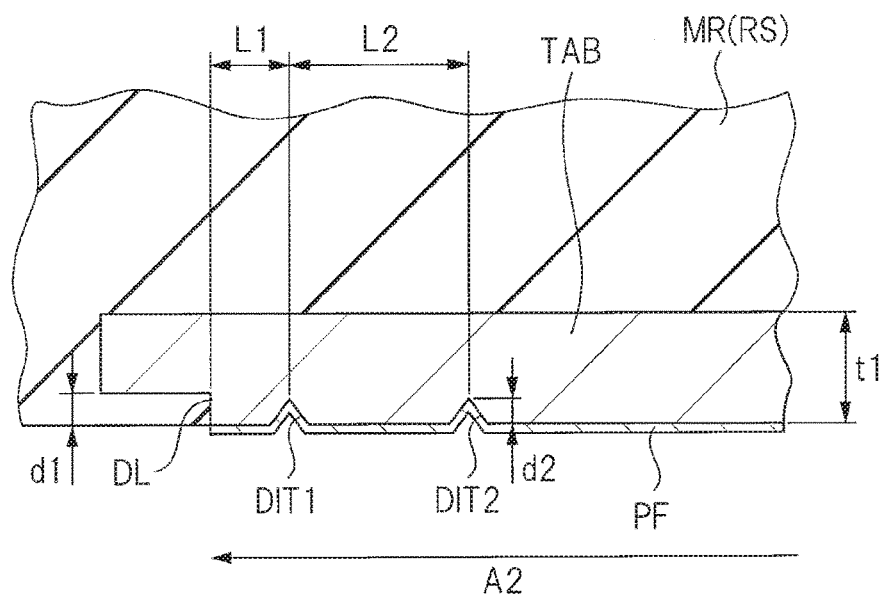
FIG. 8 is a cross-sectional view taken along line A-A of FIG. 7.

Next, FIG. 8 is a cross-sectional view taken along line A-A of FIG. 7. As shown in FIG. 8, the lower surface of the chip mounting portion TAB is exposed from the sealing body MR made of the resin RS, and the step portion DL, the ditch DIT1, and the ditch DIT2 are formed on the exposed lower surface of the chip mounting portion TAB. In this case, the inside of the step portion DL is filled with the resin RS, while the resin RS is not formed and the plating film PF is formed inside the ditch DIT1 and the ditch DIT2. Namely, on the lower surface of the chip mounting portion TAB, the plating film PF is formed over the region A2 shown in FIG. 8. Here, in the present embodiment, as the relationship between the thickness t1 of the chip mounting portion TAB, the difference in level d1 of the step portion DL, and the depth d2 of the ditch DIT1 and the ditch DIT2, the relationships of $d1 \leq \frac{1}{2} \times t1$ and $d2 \leq \frac{1}{2} \times t1$ hold as shown in FIG. 8. In addition, in the present embodiment, the distance L1 between the step portion DL and the central part of the ditch DIT1 and the distance L2 between the central part of the ditch DIT1 and the central part of the ditch DIT2 have the relationship of L1<L2 as shown in FIG. 8.

The semiconductor device in the present embodiment is configured as described above, and further detailed configuration thereof is summarized as follows.

(1) The semiconductor device PKG1 in the present embodiment includes the chip mounting portion TAB having the lower surface on which the ditch DIT1 is formed, the semiconductor chip CHP mounted on the upper surface of the chip mounting portion TAB, the lead LD electrically connected to the pad PD of the semiconductor chip CHP through the wire W, and the sealing body MR for sealing the semiconductor chip CHP. Further, the lower surface of the chip mounting portion TAB is exposed from the sealing body MR and the plating film PF is formed on the lower surface including the inside of the ditch DIT1.

(2) In the ditch DIT1, the resin RS constituting the sealing body MR is not formed.

(3) The ditch Dill is formed along the outer peripheral portion of the chip mounting portion TAB.

(4) The depth d2 of the ditch DIT1 is ½ or less of the thickness t1 of the chip mounting portion TAB.

(5) The cross-sectional shape of the ditch DIT1 is V-shape.

(6) On the lower surface of the chip mounting portion TAB, the ditch DIT2 is further formed so as to be spaced apart from the ditch DIT1.

(7) The ditch DIT2 is formed on the inner side of the chip mounting portion TAB relative to the ditch DIT1.

(8) The depth d2 of the ditch DIT1 and the depth d2 of the ditch DIT2 are both ½ or less of the thickness t1 of the chip mounting portion TAB.

(9) The plating film PF is formed also on the inner wall of the ditch DIT2.

(10) In the ditch DIT2, the resin RS constituting the sealing body MR is not formed.

(11) At the outer end of the lower surface of the chip mounting portion TAB, the step portion DL spaced apart from the ditch DIT1 is formed.

(12) The ditch DIT1 is formed on the inner side of the step portion DL.

(13) The depth d2 of the ditch DIT1 is shallower than the difference in level d1 of the step portion DL.

(14) The ditch DIT2 is formed on the inner side of the ditch DIT1 on the lower surface of the chip mounting portion TAB, and the distance L1 between the step portion DL and the center position of the ditch DIT1 is smaller than the distance L2 between the center position of the ditch DIT1 and the center position of the ditch DIT2 in a cross-sectional view.

(15) The resin RS constituting the sealing body MR is formed inside the step portion DL.

(16) The chip mounting portion TAB has a first side extending in the first direction, a second side crossing the first side, and a corner portion which is the intersection of the first side and the second side. Further, the ditch DIT1 includes a first portion parallel to the first side, a second portion parallel to the second side, and a third portion connecting the first portion and the second portion. In this case, the distance between the third portion of the ditch DIT1 and the corner portion is longer than the distance between the first portion of the ditch DIT1 and the first side, and is longer than the distance between the second portion of the ditch DIT1 and the second side.

(17) The angle formed by the third portion and the first portion of the ditch DIT1 is an obtuse angle, and the angle formed by the third portion and the second portion of the ditch DIT1 is an obtuse angle.

Figure 9:
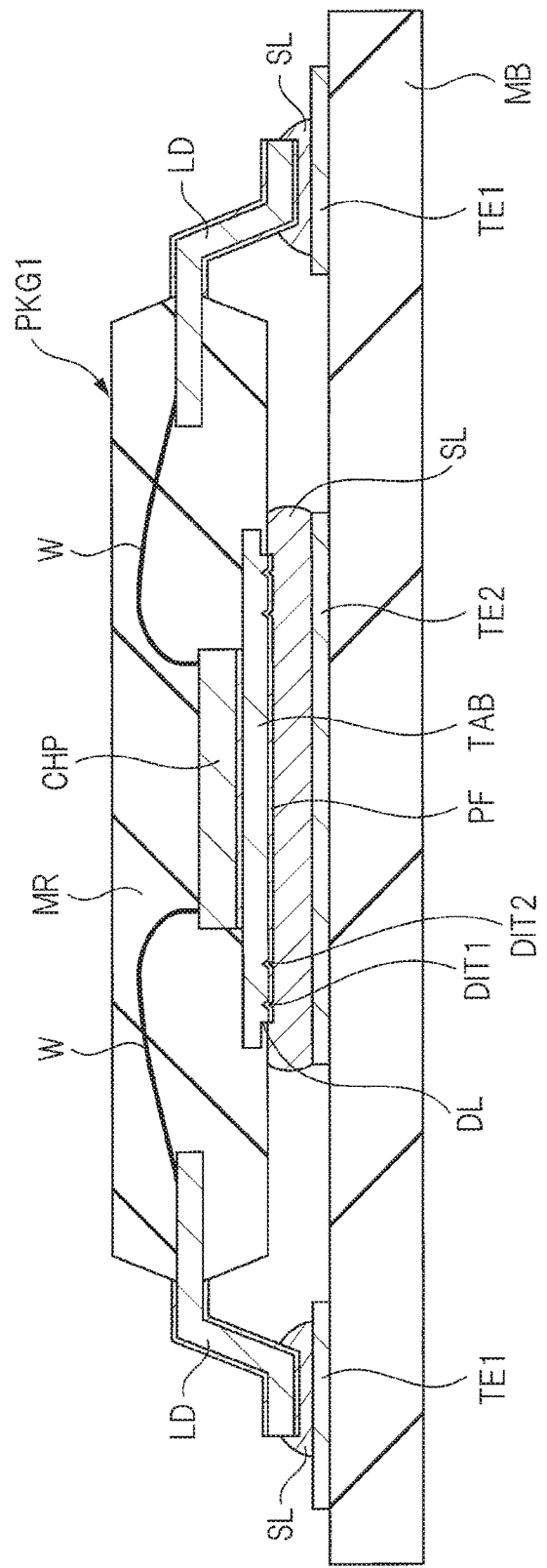
FIG. 9 is a cross-sectional view showing a state in which the semiconductor device in the embodiment is mounted on a mounting board.

Next, the state where the semiconductor device PKG1 in the present embodiment is mounted on the mounting board MB will be described. FIG. 9 is a cross-sectional view showing a state where the semiconductor device PKG1 in the present embodiment is mounted on the mounting board MB. In FIG. 9, a terminal TE1 and a terminal TE2 are formed on the upper surface of the mounting board MB, and the semiconductor device PKG1 in the present embodiment is mounted on the upper surface of the mounting board MB. Specifically, as shown in FIG. 9, the lower surface of the chip mounting portion TAB exposed from the sealing body MR and the terminal TE2 of the mounting board MB are electrically connected by the solder material SL, and a part of the lead LD protruding from the sealing body MR (outer lead) and the terminal TE1 of the mounting board MB are electrically connected by the solder material SL. In this manner, the semiconductor device PKG1 in the present embodiment is mounted on the mounting board MB.

<Structural Feature in Embodiment>

Subsequently, the structural feature in the present embodiment will be described. For example, the structural feature in the present embodiment is that the resin RS is not formed inside the ditch DIT1 and inside the ditch DIT2 and the plating film PF is formed over the inner wall of the ditch DIT1 and the inner wall of the ditch DIT2 as shown in FIG. 8. In other words, the structural feature in the present embodiment is that the plating film PF is formed over the region A2 including the ditch DIT1 and the ditch DIT2 in the lower surface of the chip mounting portion TAB as shown in FIG. 8.

Thus, as shown in FIG. 9, the entire region including the ditch DIT1 and the ditch DIT2 (region A2 in FIG. 8) can be used for the electrical connection with the terminal TE2 of the mounting board MB. Therefore, according to the present embodiment, the connection reliability between the semiconductor device PKG1 and the mounting board MB can be improved. Furthermore, since the ditch DIT1 and the ditch DIT2 can be brought into contact with the terminal TE2 of the mounting board MB through the plating film PF, the heat radiation efficiency from the chip mounting portion TAB can be improved. Namely, according to the present embodiment, since the entire region A2 including the ditch DIT1 and the ditch DIT2 can be used as the heat radiation path, the heat generated in the semiconductor chip CHP can be radiated efficiently from the lower surface of the chip mounting portion TAB. Thus, according to the present embodiment, not only the connection reliability between the semiconductor device PKG1 and the mounting board MB can be improved, but the suppression of the malfunction of the semiconductor device PKG1 can be achieved by the improvement in the heat radiation efficiency, so that the reliability of the semiconductor device PKG1 can be greatly improved by the synergy effect thereof.

For example, in the related technique, the resin RS remains inside the ditch DIT, the plating film PF is not formed on the inner wall of the ditch DIT, and the resin RS is formed in the region B1 including the ditch DIT in the lower surface of the chip mounting portion TAB as shown in FIG. 3. Therefore, in the related technique, the region B1 cannot be used for the connection with the mounting board, and only the region A1 on the inner side of the ditch DIT can be used for the connection with the mounting board. Accordingly, since the contact area of the conductive member (plating film PF) between the semiconductor device and the mounting board is small in the related technique, the connection reliability between the chip mounting portion TAB and the mounting board decreases, and since the region contributing to the increase in the heat radiation efficiency also decreases, the heat radiation efficiency also decreases. As a result, according to the related technique, since the resin RS remains inside the ditch DIT, the connection reliability between the semiconductor device and the mounting board decreases and the heat radiation efficiency from the semiconductor device decreases, so that the reliability of the semiconductor device in the related technique decreases due to the synergy effect thereof.

On the other hand, according to the semiconductor device PKG1 in the present embodiment, the resin RS is not formed inside the ditch DIT1 and inside the ditch DIT2, and the plating film PF is formed therein as shown in FIG. 8. Thus, according to the present embodiment, the formation region of the ditch DIT1 and the ditch DIT2 can also be used for the connection with the mounting board MB. Further, since the region A2 including the ditch DIT1 and the ditch DIT2 is wider than the region A1 in the related technique, the connection area between the semiconductor device PKG1 and the mounting board MB can be increased in the semiconductor device PKG1 in the present embodiment as compared to that in the related technique. As a result, according to the present embodiment, the connection reliability between the semiconductor device PKG1 and the mounting board MB can be improved, and the heat radiation efficiency from the semiconductor device PKG1 can be improved as compared to the related technique. Therefore, according to the present embodiment, the reliability of the semiconductor device can be improved as compared to the related technique.

<Manufacturing Method of Semiconductor Device>

The semiconductor device PKG1 in the present embodiment is configured as described above, and the manufacturing method thereof will be described below with reference to the drawings.

Figure 10:
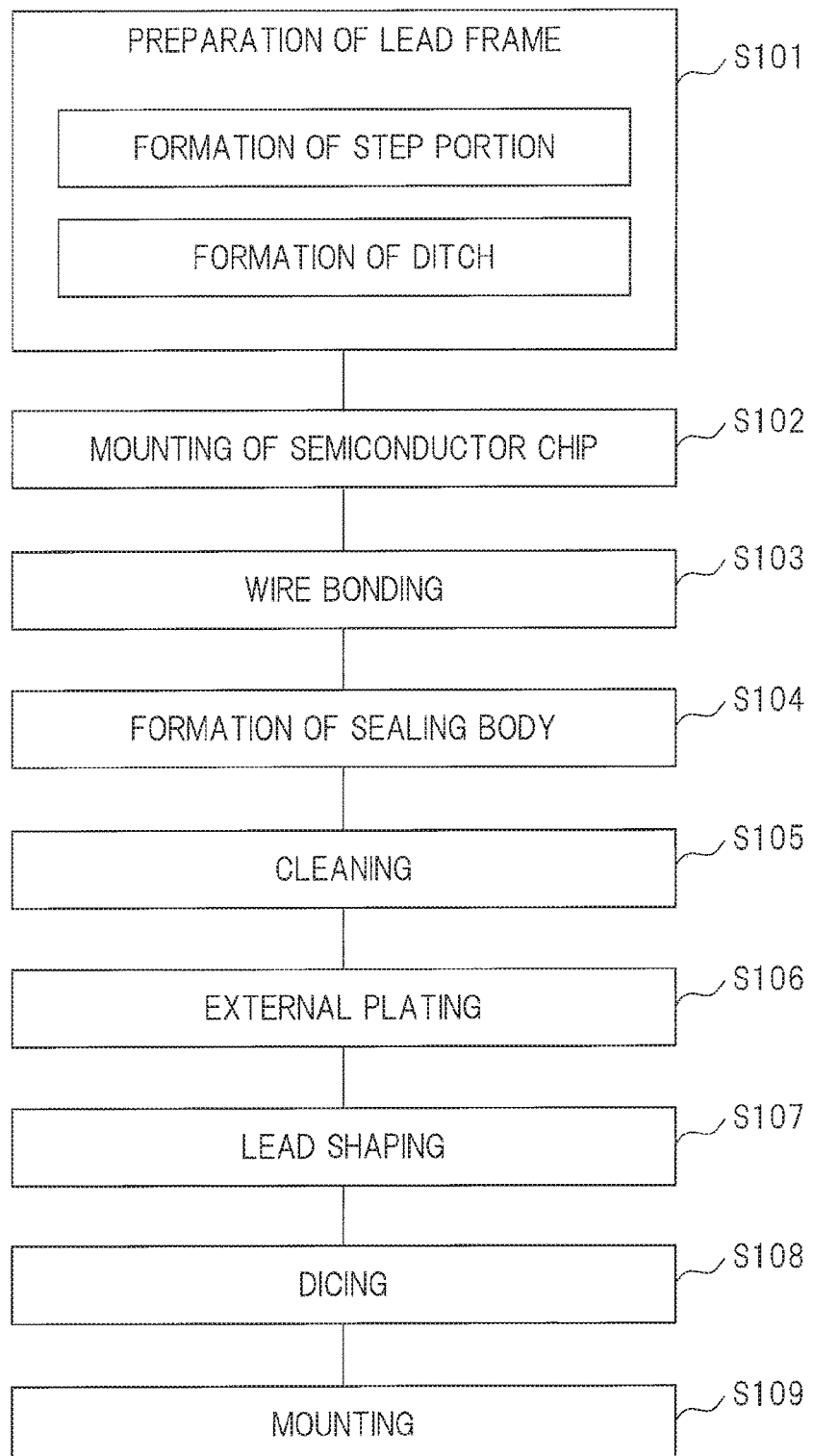
FIG. 10 is a flowchart showing a flow of the manufacturing process of the semiconductor device in the embodiment.

First, FIG. 10 is a flowchart showing the flow of the manufacturing process of the semiconductor device in the present embodiment, and the flow of the manufacturing process of the semiconductor device in the present embodiment will be briefly described based on this flowchart. In FIG. 10, for example, a lead frame including a lead and a chip mounting portion is prepared (S101). At this time, the step portion and ditch are formed in advance on the lower surface of the chip mounting portion of the prepared lead frame.

Next, a semiconductor chip is mounted on the chip mounting portion of the lead frame (chip mounting process) (S102). Thereafter, the pad formed on the surface of the semiconductor chip and the lead provided on the lead frame are electrically connected by a conductive member (wire) (wire bonding process) (S103). Subsequently, a sealing body made of resin is formed so as to cover the semiconductor chip and apart of the lead (inner lead part) and expose the lower surface of the chip mounting portion (molding process) (S104). Then, the lower surface of the chip mounting portion is cleaned (cleaning process) (S105). At this time, if the resin leaked onto the lower surface of the chip mounting portion exists, the resin is removed from the lower surface of the chip mounting portion by this cleaning process.

Thereafter, a plating film is formed on the lower surface of the chip mounting portion exposed from the sealing body and the other part of the lead (outer lead part) (plating process) (S106). Next, after shaping the lead (shaping process) (S107), the semiconductor device is diced into pieces (dicing process) (S108). In this manner, the semiconductor device in the present embodiment can be manufactured. The manufactured semiconductor device is mounted on, for example, a mounting board (mounting process) (S109). Specifically, the lower surface of the chip mounting portion exposed from the sealing body and the terminal of the mounting board are connected through the solder material, and the lead part exposed from the sealing body and the terminal of the mounting board are connected through the solder material. In the manner described above, the tab exposure type semiconductor device is mounted on the mounting board.

Figure 11:
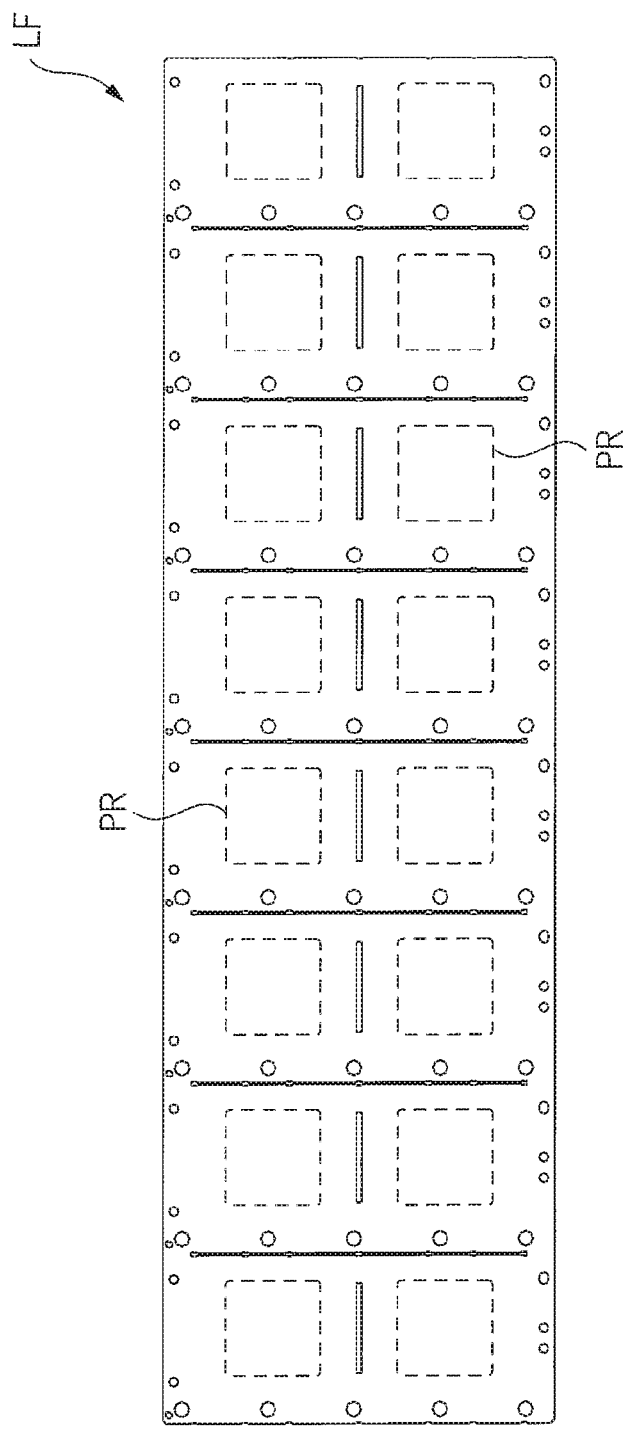
FIG. 11 is a plan view showing the manufacturing process of the semiconductor device in the embodiment.

Subsequently, the manufacturing process of the semiconductor device in the present embodiment will be further described with reference to the drawings. First, as shown in FIG. 11, a lead frame LF in which product regions PR are arranged in an array is prepared. Here, FIG. 12(a) is an enlarged plan view showing the product region PR, and FIG. 12(b) is a cross-sectional view showing one section of the product region PR. As shown in FIG. 12(a), the rectangular chip mounting portion TAB is arranged in the central part of the product region PR, and the plurality of leads LD are arranged around the chip mounting portion TAB. In addition, as shown in FIG. 12(b), on the lower surface of the chip mounting portion TAB, the step portion DL, the ditch DIT1, and the ditch DIT2 are formed in advance so as to be spaced apart from each other. Specifically, the ditch DIT1 is formed on the inner side of the step portion DL, and the ditch DIT2 is formed on the inner side of the ditch DIT1. Further, the depth of the ditch DIT1 and the depth of the ditch DIT2 are shallower than the difference in level of the step portion DL. In addition, the distance between the step portion DL and the center position of the ditch DIT1 is smaller than the distance between the center position of the ditch DIT1 and the center position of the ditch DIT2 in a cross-sectional view.

In this case, the step portion DL, the ditch DIT1, and the ditch DIT2 are formed by, for example, a press method, and a vertical step is formed in the step portion DL, while the cross-sectional shape of the ditch DIT1 and the ditch DIT2 is V-shape.

Furthermore, as shown in FIG. 12(b), the arrangement position of the lead LD is higher than the arrangement position of the chip mounting portion TAB. In other words, the arrangement position of the chip mounting portion TAB is lower than the arrangement position of the lead LD.

Next, the semiconductor chip CHP having a pad formed on the surface thereof is prepared. Then, as shown in FIGS. 13(a) and 13(b), the semiconductor chip CHP is mounted on the upper surface of the chip mounting portion TAB. Thereafter, as shown in FIGS. 14(a) and 14(b), the pad formed on the semiconductor chip CHP and the lead LD are electrically connected by the wire W.

Figure 15:
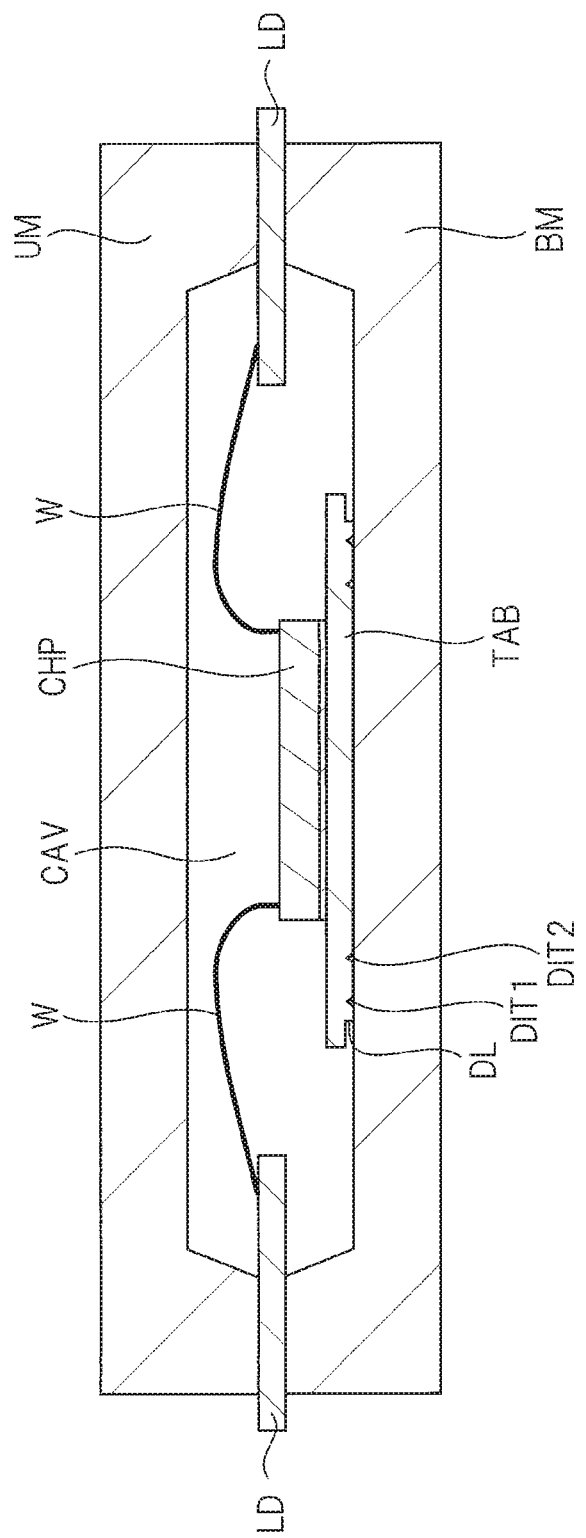
FIG. 15 is a cross-sectional view showing the manufacturing process of the semiconductor device continued from FIG. 14.
Figure 16:
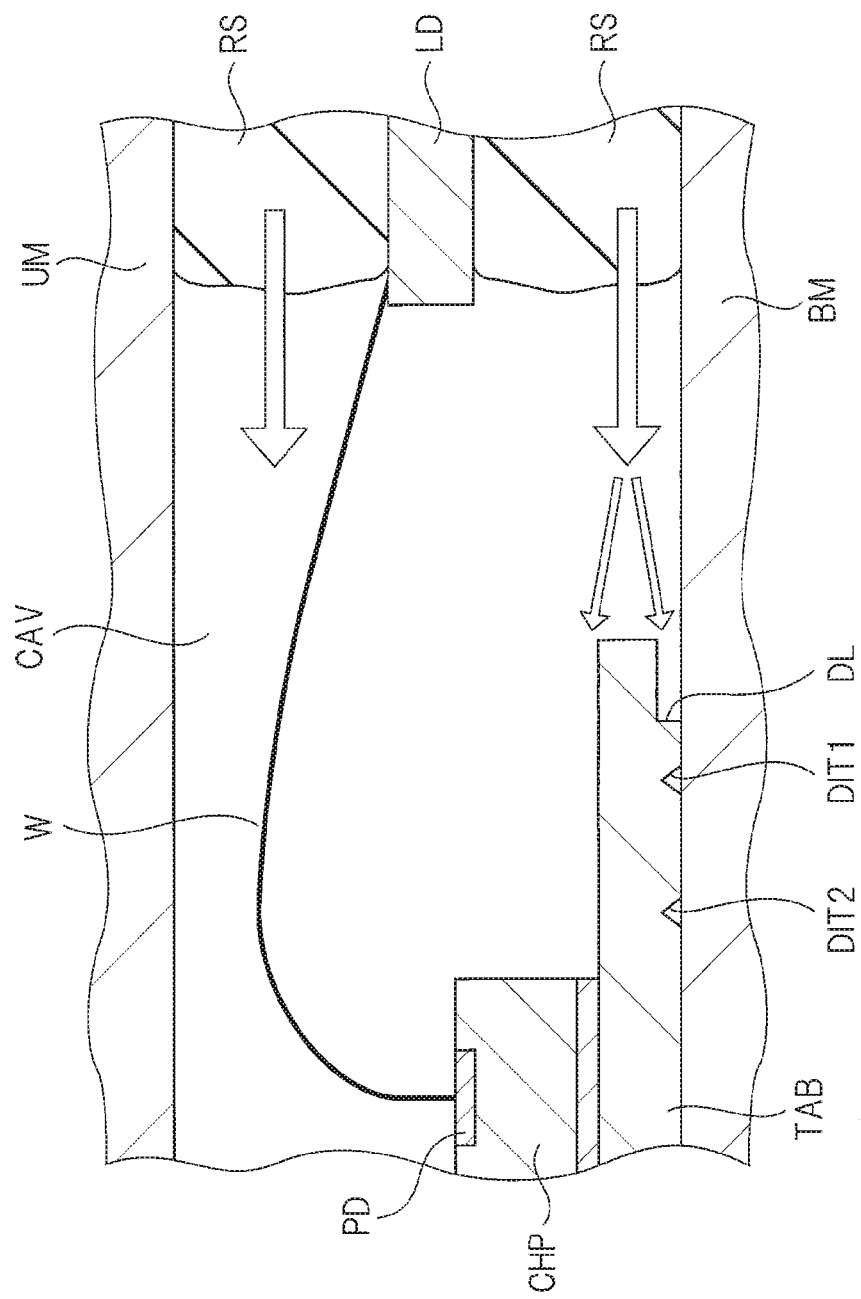
FIG. 16 is a cross-sectional view showing the manufacturing process of the semiconductor device continued from FIG. 15.

Subsequently, as shown in FIG. 15, the lead frame is sandwiched between the lower mold BM and the upper mold UM while forming the cavity CAV. Specifically, the chip mounting portion TAB on which the semiconductor chip CHP is mounted is disposed on the lower mold BM, and the lead LD is sandwiched between the lower mold BM and the upper mold UM. Thus, the chip mounting portion TAB on which the semiconductor chip CHP is mounted is disposed in the cavity CAV sealed by the lower mold BM and the upper mold UM. In this state, as shown in FIG. 16, the resin RS is injected into the cavity CAV hermetically sealed by the lower mold BM and the upper mold UM. At this time, since the step portion DL is formed at the outer end of the chip mounting portion TAB in the present embodiment, the injection pressure by the resin RS injected from the side face of the chip mounting portion TAB is dispersed as shown in FIG. 16. As a result, the resin RS hardly intrudes below the lower surface of the chip mounting portion TAB disposed on the lower mold BM. Namely, in the present embodiment, the step portion DL formed at the outer end of the chip mounting portion TAB has a function of dispersing the injection pressure by the resin RS to suppress the resin RS from entering the lower surface of the chip mounting portion TAB. In the manner described above, the process of sealing the semiconductor chip CHP with the resin RS can be performed while exposing a part of the lead LD and the lower surface of the chip mounting portion TAB.

As described above, in the present embodiment, the step portion DL is provided at the outer end of the chip mounting portion TAB in order to suppress the resin RS from entering the lower surface of the chip mounting portion TAB, but it is difficult to reliably suppress the resin RS from entering the lower surface of the chip mounting portion TAB simply by providing the step portion DL. In other words, in the process of sealing the semiconductor chip CHP with the resin RS while exposing the lower surface of the chip mounting portion TAB, even if the step portion DL for preventing the leakage of the resin RS is provided, the resin RS may enter the lower surface of the chip mounting portion TAB.

Figure 17:
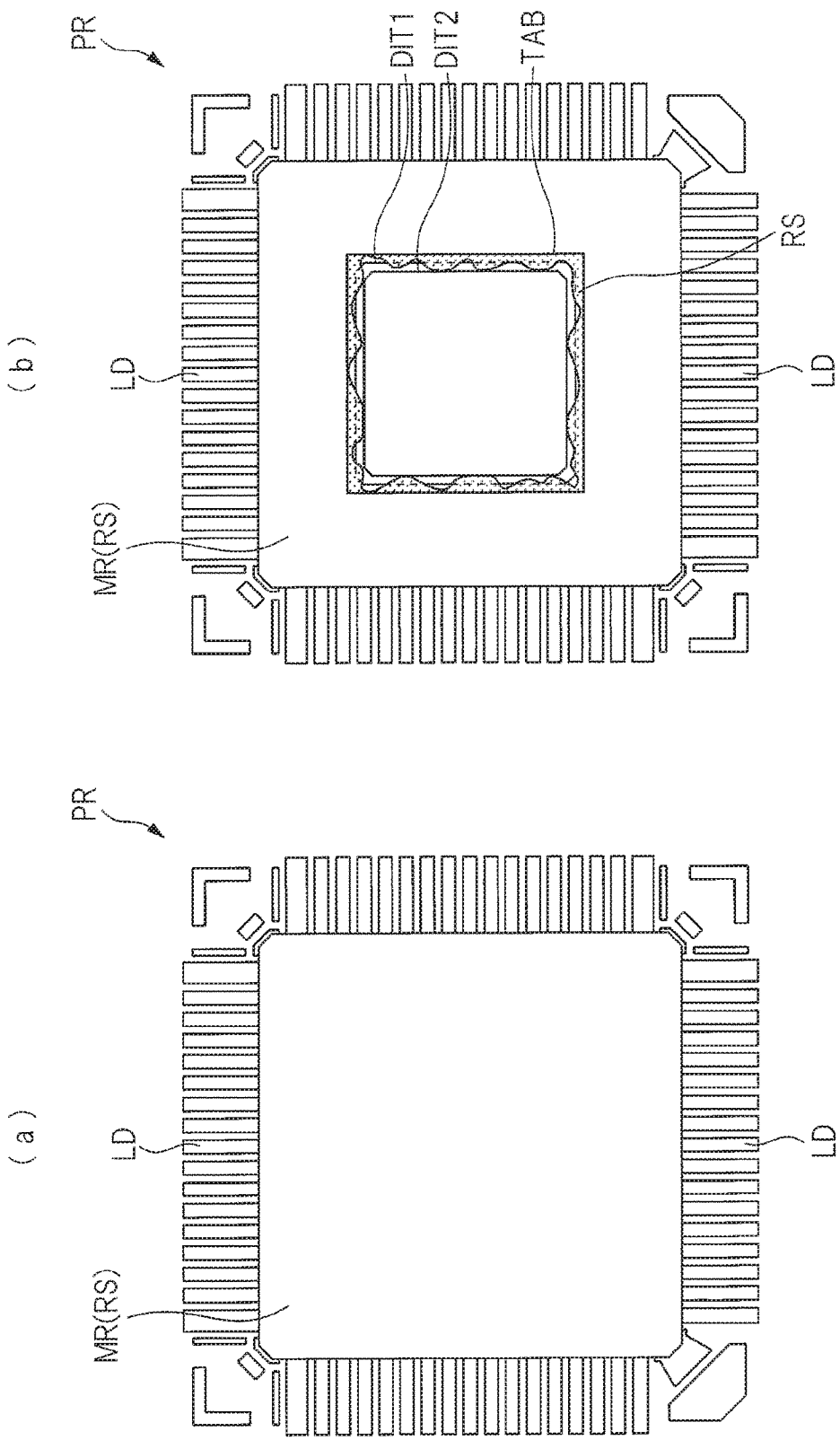
FIG. 17(a) is a plan view seen from the upper surface side and FIG. 17(b) is a plan view seen from the lower surface side each showing the manufacturing process of the semiconductor device continued from FIG. 16.

Specifically, FIGS. 17(a) and 17(b) are diagrams showing the state after forming the sealing body MR made of the resin RS in the product region PR of the lead frame. In particular, FIG. 17(a) is a plan view of the sealing body MR seen from the upper surface side, and FIG. 17(b) is a plan view of the sealing body MR seen from the lower surface side.

As shown in FIG. 17(b), the lower surface of the chip mounting portion TAB is exposed from the lower surface of the sealing body MR, and FIG. 17(b) shows the case where the resin RS enters the lower surface of the chip mounting portion TAB. As shown in FIG. 17(b), it can be seen that the ditch DIT1 and the ditch DIT2 spaced apart from each other are formed along the outer peripheral portion of the chip mounting portion TAB on the lower surface of the chip mounting portion TAB. In other words, the ditch DIT1 is formed on the outside along the outer peripheral portion of the chip mounting portion TAB, and the ditch DIT2 is formed on the inner side of the ditch DIT1.

Here, although the resin RS enters the lower surface of the chip mounting portion TAB as shown in FIG. 17(b), it can be seen that the resin RS is stopped by the ditch DIT1 and the ditch DIT2 formed on the lower surface of the chip mounting portion TAB, and the resin RS does not enter the region on the inner side of the ditch DIT2. Namely, it can be seen that since the ditch DIT1 and the ditch DIT2 are provided on the inner side of the step portion DL on the lower surface of the chip mounting portion TAB in the present embodiment, the entry of the resin RS which cannot be prevented by the step portion DL is stopped by the ditch DIT1 and the ditch DIT2. In other words, it can be seen that even if the resin RS enters the lower surface of the chip mounting portion TAB, since the ditch DIT1 and the ditch DIT2 are provided on the inner side of the step portion DL according to the present embodiment, the entry of the resin RS into the inner region of the ditch DIT2 on the inner side is suppressed.

Figure 18:
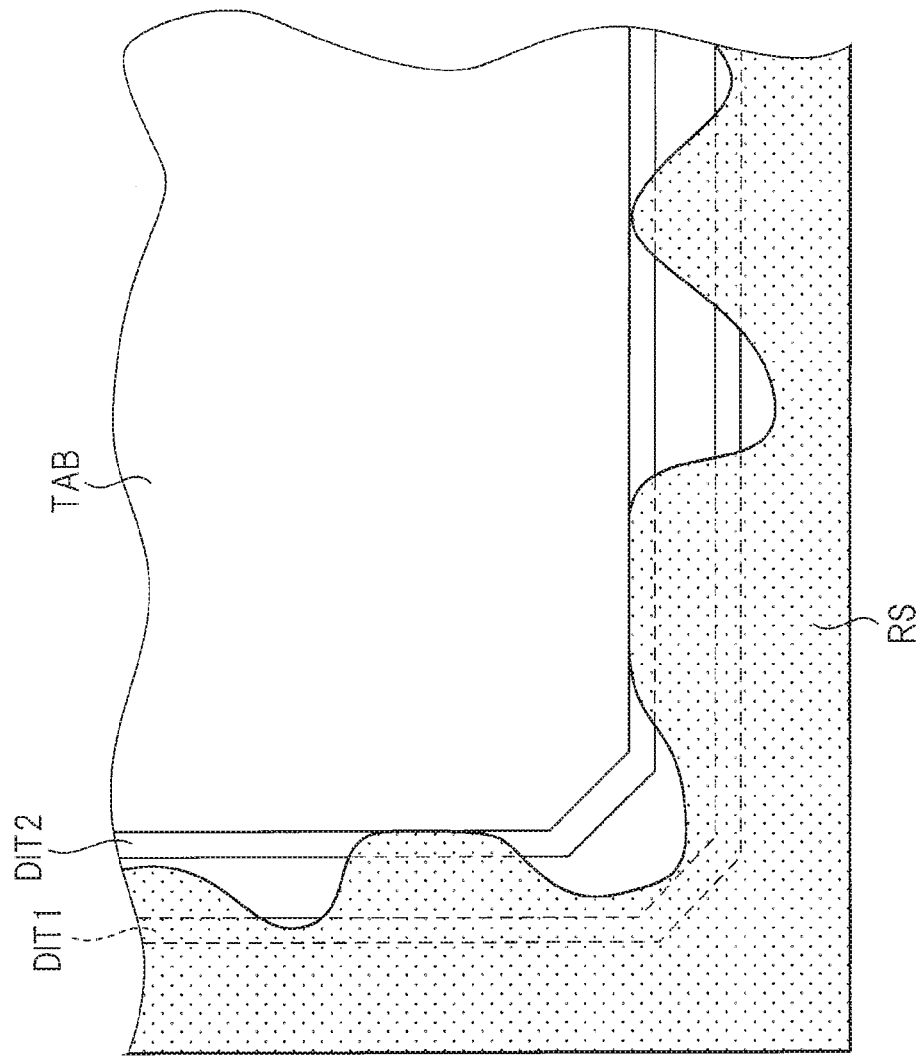
FIG. 18 is a schematic diagram showing that the entry of resin is suppressed by a plurality of ditches formed on the lower surface of the chip mounting portion.

Specifically, FIG. 18 is a schematic diagram showing that the entry of the resin RS is suppressed by the ditch DIT1 and the ditch DIT2 formed on the lower surface of the chip mounting portion TAB. In particular, as shown in FIG. 18, it can be seen that the entry of the resin RS into the inner region of the ditch DIT2 is suppressed in the present embodiment. At this time, as is apparent from FIG. 18, when the resin RS enters both the ditch DIT1 and the ditch DIT2 formed on the lower surface of the chip mounting portion TAB, the amount of the resin RS entering the ditch DIT1 is larger than the amount of the resin RS entering the ditch DIT2. In other words, the entry of the resin RS is first suppressed by the ditch DIT1 formed on the outside, and the resin RS that is not stopped by the ditch DIT1 is stopped by the ditch DIT2 formed on the inside. Accordingly, as shown in FIG. 18, the amount of the resin RS entering the ditch DIT1 is larger than the amount of the resin RS entering the ditch DIT2.

Figure 19:
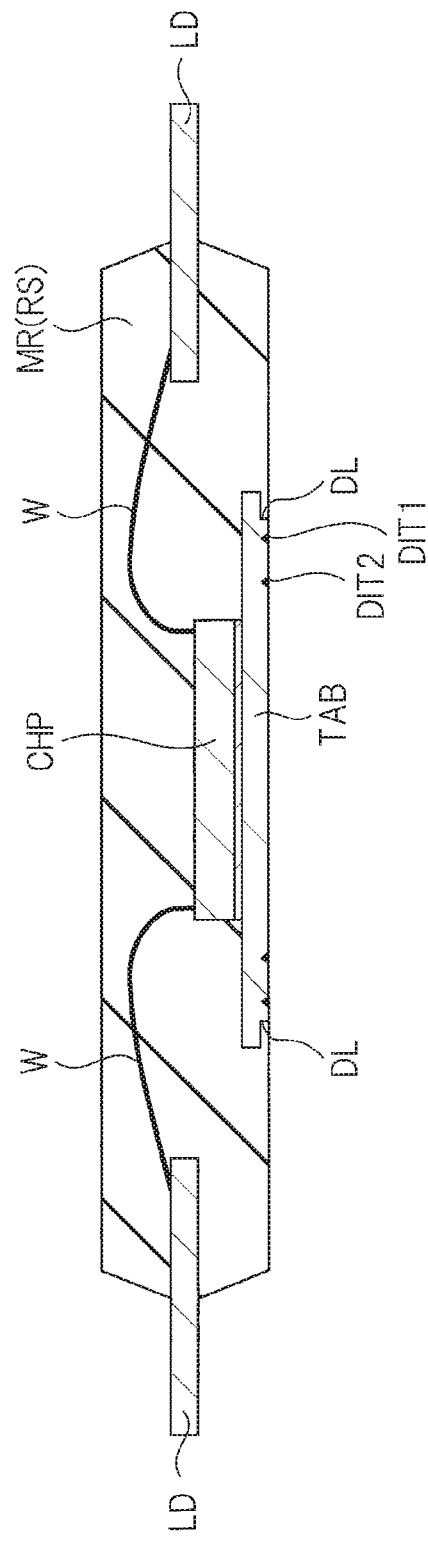
FIG. 19 is a cross-sectional view corresponding to the plan views shown in FIGS. 17(a) and 17(b)

As described above, the process of sealing the semiconductor chip CHP with the resin RS can be performed while exposing a part of the lead LD and the lower surface of the chip mounting portion TAB. FIG. 19 shows a state where the resin RS is embedded in the ditch DIT1 and the ditch DIT2 formed on the lower surface of the chip mounting portion TAB at this time.

Next, as shown in FIGS. 20(a) and 20(b), the lower surface of the chip mounting portion TAB is cleaned. This removes the resin RS embedded in the ditch DIT1 and the ditch DIT2. For example, the process of cleaning the lower surface of the chip mounting portion TAB can be performed by a combination of electrolytic deburring (electrolysis) and hydraulic deburring (high pressure water jet). Namely, in the cleaning process in the present embodiment, the attached resin RS is floated by the electrolytic deburring, and then the floated resin RS is blown away and removed by the hydraulic deburring.

Subsequently, as shown in FIGS. 21(a) and 21(b), the plating film PF is formed on a part of the lead LD exposed from the sealing body MR and the lower surface of the chip mounting portion TAB exposed from the sealing body MR. Specifically, in the exterior plating process in the present embodiment, the plating film PF made of pure tin (Sn) is formed by, for example, an electrolytic plating method. It should be noted that it is only required to form the plating film PF from a material containing no lead (lead-free material), and a material made of tin-bismuth or tin-copper may be used in addition to pure tin.

Figure 20:
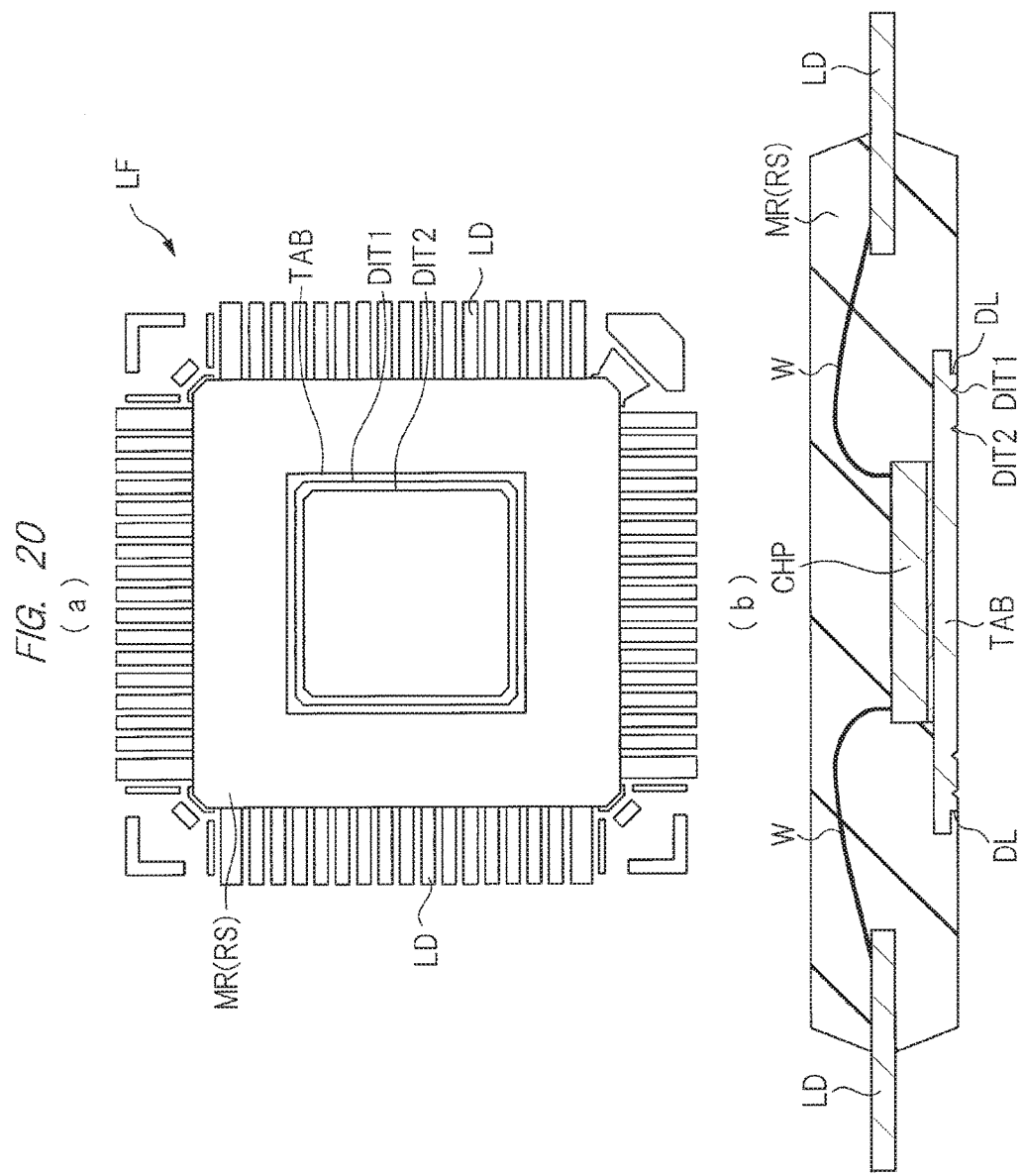
FIG. 20(a) is a plan view and FIG. 20(b) is a cross-sectional view each showing the manufacturing process of the semiconductor device continued from FIG. 19.

From the foregoing, in the present embodiment, when the resin RS enters the ditch DIT1 and the ditch DIT2 formed on the lower surface of the chip mounting portion TAB by the process of forming the sealing body MR (see FIG. 18), the resin RS embedded in the ditch DIT1 and the ditch DIT2 is removed by the cleaning process (see FIG. 20). Then, in the exterior plating process, the plating film PF is formed also on the inner wall of the ditch DIT1 and the inner wall of the ditch DIT2 (see FIGS. 21(a) and 21(b)).

Figure 22:
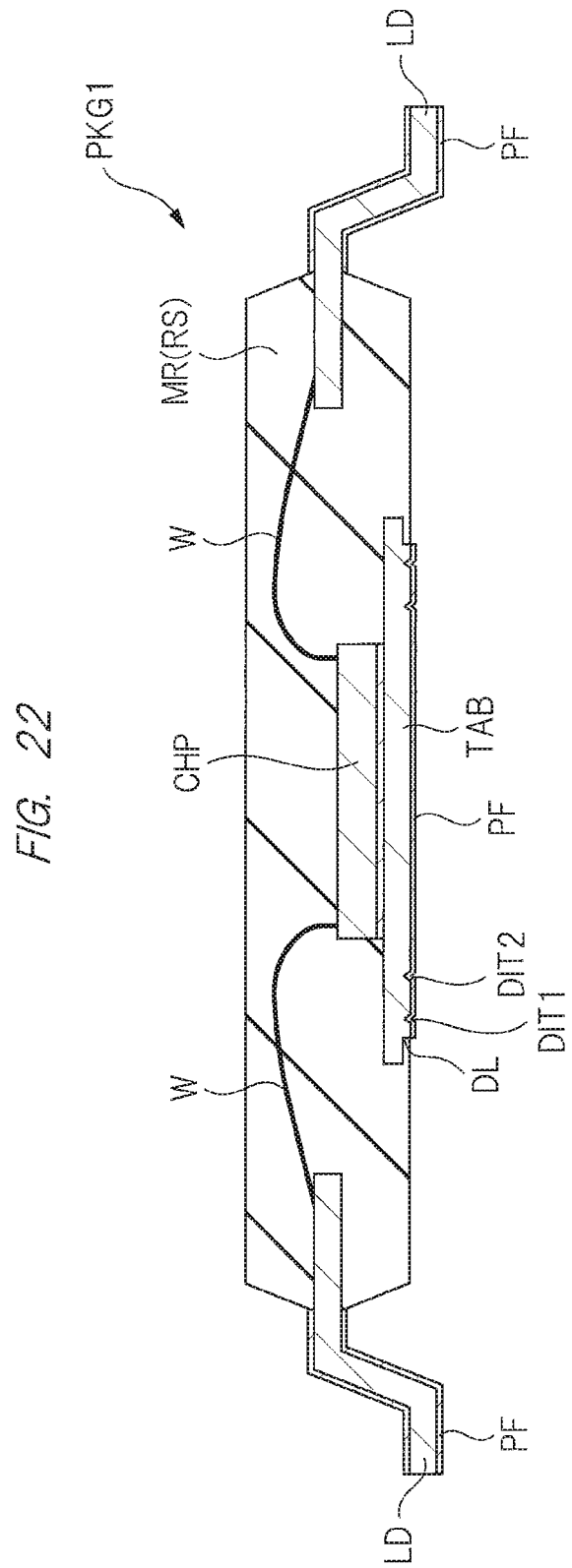
FIG. 22 is a cross-sectional view showing the manufacturing process of the semiconductor device continued from FIG. 21.

Thereafter, as shown in FIG. 22, for example, the lead LD protruding from the sealing body MR is formed into a gull-wing shape, and then the semiconductor device PKG1 is diced into pieces. In the manner described above, the semiconductor device PKG1 in the present embodiment can be manufactured.

<Feature Including Manufacturing Method in Embodiment>

In the basic idea in the present embodiment, on the premise that a ditch for suppressing the spread of resin leakage is provided on the lower surface of the chip mounting portion in the tab exposure type semiconductor device, a cleaning process for removing the resin entering the inside of the ditch together with the resin leaked onto the lower surface of the chip mounting portion is performed after the sealing process with the resin, and a plating film is formed also inside the ditch after the cleaning process.

Further, the present embodiment has features embodying the basic idea described above, and the features including the manufacturing method in the present embodiment will be described below.

Figure 21:
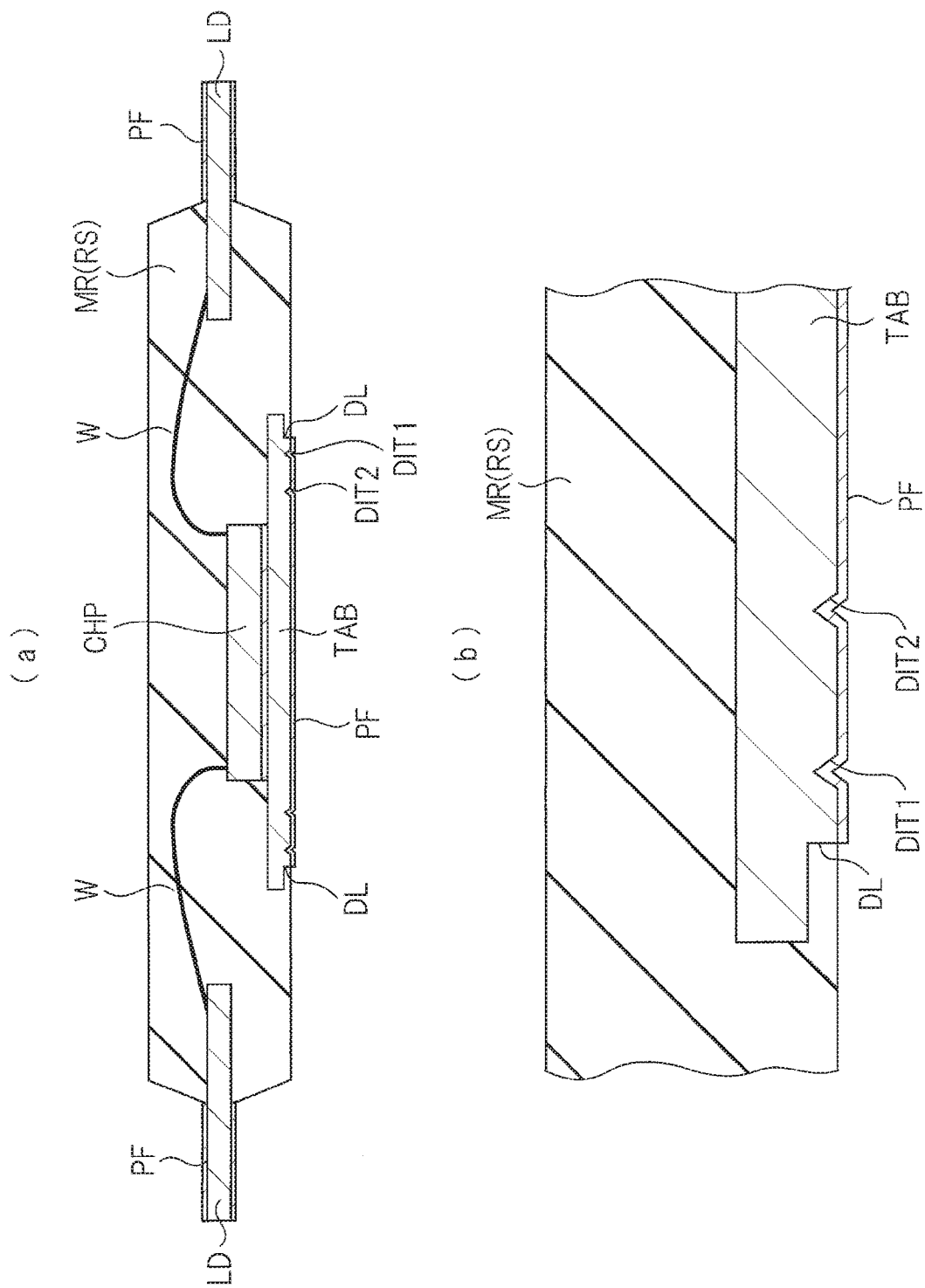
FIG. 21(a) is a cross-sectional view showing the manufacturing process of the semiconductor device continued from FIG. 20.
FIG. 21(b) is a partially enlarged view of FIG. 21(a)

The first feature in the present embodiment is that the plating film PF is not formed in advance in the prepared lead frame LF, but is formed in the manufacturing process of the semiconductor device. In addition, the first feature in the present embodiment is that the plating film PF is formed on the lower surface of the chip mounting portion TAB in the process after the process of cleaning the lower surface of the chip mounting portion TAB exposed from the sealing body MR is performed as shown in FIGS. 20 and 21. In this manner, according to the present embodiment, the plating film PF can be formed on the inner wall of the ditch DIT1 and the inner wall of the ditch DIT2 as shown in FIG. 21(b). In other words, according to the first feature in the present embodiment, when the resin RS enters the ditch DIT1 and the ditch DIT2 formed on the lower surface of the chip mounting portion TAB by the process of forming the sealing body MR, the resin RS embedded in the ditch DIT1 and the ditch DIT2 is removed by the process of cleaning the lower surface of the chip mounting portion TAB. Further, in the exterior plating process, the plating film PF can be formed also on the inner wall of the ditch DIT1 and the inner wall of the ditch DIT2. As a result, according to the present embodiment, for example, the entire region including the ditch ditch DIT1 and the ditch DIT2 (region A2 in FIG. 8) can be used for electrical connection with the terminal TE2 of the mounting board MB as shown in FIG. 9. Therefore, according to the present embodiment, the connection reliability between the semiconductor device PKG1 and the mounting board MB can be improved. Furthermore, since the ditch DIT1 and the ditch DIT2 can be brought into contact with the terminal TE2 of the mounting board MB through the plating film PF, the heat radiation efficiency from the chip mounting portion TAB can be improved. Namely, according to the present embodiment, since the region including the ditch DIT1 and the ditch DIT2 can be used as the heat radiation path, the heat generated in the semiconductor chip CHP can be radiated efficiently from the lower surface of the chip mounting portion TAB. Therefore, according to the present embodiment, not only the connection reliability between the semiconductor device PKG1 and the mounting board MB can be improved, but the suppression of the malfunction of the semiconductor device PKG1 can be achieved by the improvement in the heat radiation efficiency, so that the reliability of the semiconductor device PKG1 can be improved by the synergy effect thereof.

For example, in the related technique, as the lead-free measures, the plating film PF comprised of a laminated film of Ni (nickel)/Pd (palladium)/Au (gold) is used, and a Ni/Pd/Au film is formed on the lead frame in advance. However, in the related technique thus configured, it is difficult to perform the cleaning process for removing the resin RS leaked onto the lower surface of the chip mounting portion TAB. This is because since the plating film PF is formed on the lead frame LF in advance in the related technique, it is inevitable that the plating film PF is adversely affected by performing the cleaning process in the related technique. Specifically, in the related technique, when the cleaning process is performed, nickel constituting the Ni/Pd/Au film piles up on the lower surface of the chip mounting portion TAB. Then, when nickel piles up on the lower surface of the chip mounting portion TAB, since this nickel is easily oxidized, the connection reliability between the chip mounting portion TAB and the mounting board MB is lowered. Therefore, in the related technique, it is difficult to perform the cleaning process for removing the resin RS leaked onto the lower surface of the chip mounting portion TAB.

On the other hand, according to the present embodiment, the plating film PF made of, for example, pure tin is formed in the manufacturing process of the semiconductor device (exterior plating process) instead of forming the plating film PF comprised of a laminated film of Ni (nickel)/Pd (palladium)/Au (gold) on the prepared lead frame LF in advance as in the related technique. Thus, according to the present embodiment, the sealing body MR is formed in the process before the exterior plating process, and the process of cleaning the lower surface of the chip mounting portion TAB can be inserted between the process of forming the sealing body MR and the exterior plating process. This is because since the exterior plating process is performed after the cleaning process is performed according to this configuration, the cleaning process does not affect the plating film PF.

From the foregoing, the first feature in the present embodiment is that the plating film PF made of a lead-free material is formed in the manufacturing process of the semiconductor device. In addition, the first feature in the present embodiment is that the exterior plating process for forming the plating film PF is performed in the process after the process of forming the sealing body MR. Further, the first feature makes it possible to insert the process of cleaning the lower surface of the chip mounting portion TAB in the process before the exterior plating process. As a result, according to the present embodiment, even when the resin RS also enters the ditch DIT1 and the ditch DIT2 formed on the lower surface of the chip mounting portion TAB, the resin RS embedded in the ditch DIT1 and the ditch DIT2 is removed by the process of cleaning the lower surface of the chip mounting portion TAB, and the plating film PF is formed also on the inner wall of the ditch DIT1 and the inner wall of the ditch DIT2 in the exterior plating process. As a result, the inside of the ditch DIT1 and the inside of the ditch DIT2 also contribute to the connection between the semiconductor device PKG1 and the mounting board MB, so that the connection reliability between the semiconductor device PKG1 and the mounting board MB can be improved and the heat radiation characteristics of the semiconductor device PKG1 can be improved according to the present embodiment.

The basic idea in the present embodiment is common to the related technique in that the ditch is provided on the lower surface of the chip mounting portion, but is different from the related technique in that the ditch provided in the present embodiment is based on the premise that the resin entering the inside of the ditch is removed, whereas the ditch provided in the related technique is not based on the premise that the resin entering the inside of the ditch is removed. In other words, the ditch in the present embodiment and the ditch provided in the related technique are common in that both of the ditches have a function of suppressing the spread of resin leakage on the lower surface of the chip mounting portion. However, since the design concept of the ditch provided in the related technique is not based on the premise that the resin entering the inside of the ditch is removed, the design concept has a basic idea specialized for increasing the internal volume of the ditch as much as possible to improve the effect of stopping the spread of the resin leakage. On the other hand, since the design concept of the ditch provided in the present embodiment is based on a premise that the resin entering the inside of the ditch is removed, the design concept has a basic idea in consideration of not only the function of stopping the spread of the resin leakage with the ditch but also the ease of removal of the resin entering the inside of the ditch. Thus, since the basic idea in the present embodiment is different in the orientation (viewpoint) from the basic idea in the related technique, the configuration of the semiconductor device embodying the basic idea in the present embodiment is different from the configuration of the semiconductor device in the related technique. In other words, the lower surface configuration of the chip mounting portion in the present embodiment is different from the lower surface configuration of the chip mounting portion in the related technique.

In the following, the second feature in the present embodiment embodying this basic idea will be described. The second feature in the present embodiment is that the shape of the ditch DIT1 and the shape of the ditch DIT2 are devised in order to easily remove the resin RS entering the inside of the ditch DIT1 and the inside of the ditch DIT2. Specifically, as shown in FIG. 8, the ditch DIT1 and the ditch DIT2 are configured so that each of the depth d2 of the ditch DIT1 and the depth d2 of the ditch DIT2 is ½ or less of the thickness t1 of the chip mounting portion TAB. In this manner, according to the present embodiment, the depth d2 of the ditch DIT1 and the depth d2 of the ditch DIT2 can be made shallower. This means that the resin RS entering the inside of the ditch DIT1 and the ditch DIT2 can be easily removed. As a result, according to the second feature in the present embodiment, the resin RS entering the ditch DIT1 and the ditch DIT2 can be reliably removed by the cleaning process for cleaning the lower surface of the chip mounting portion TAB.

In this regard, in the related technique, for example, the depth of the ditch DIT is greater than ½ of the thickness of the chip mounting portion TAB as shown in FIG. 3. This is because since the related technique is not based on the premise that the resin RS entering the inside of the ditch DIT is removed, the focus is placed only on improving the effect of stopping the spread of the resin leakage by increasing the internal volume of the ditch DIT as much as possible. On the other hand, since the ditch DIT1 (ditch DIT2) provided in the present embodiment is based on the premise that the resin RS entering the inside of the ditch DIT1 (ditch DIT2) is removed, the ditch DIT1 (ditch DIT2) is designed in consideration of not only the function of stopping the spread of the resin leakage but also the ease of removal of the resin RS entering the inside of the ditch DIT1 (ditch DIT2). As a result, in the present embodiment, the depth d2 of the ditch DIT1 (ditch DIT2) is configured so as to be ½ or less of the thickness t1 of the chip mounting portion TAB in order to improve the removal characteristics of the entering resin RS.

It is also possible to represent the second feature in the present embodiment in another expression as shown below. Namely, for example, it can also be said that the ditch DIT1 (ditch DIT2) is configured so that the depth d2 of ditch DIT1 (ditch DIT2) is smaller than the difference in level d1 of the step portion DL as shown in FIG. 8. Thus, according to the present embodiment, the depth d2 of the ditch DIT1 (ditch DIT2) can be made shallower. This means that the resin RS entering the inside of the ditch DIT1 (ditch DIT2) can be easily removed. As a result, according to the second feature in the present embodiment, the resin RS entering the ditch DIT1 (ditch DIT2) can be reliably removed by the cleaning process for cleaning the lower surface of the chip mounting portion TAB.

Namely, the resin RS is embedded in the step portion DL, and the removal of the embedded resin RS is not premised. On the other hand, the ditch DIT1 (ditch DIT2) is premised to remove the entering resin RS. Therefore, the step portion DL and the ditch DIT1 (ditch DIT2) differ as to whether to remove the resin RS or not, and since the resin RS can be removed more easily when the depth becomes shallower, the depth d2 of the ditch DIT1 (ditch DIT2) is configured so as to be smaller than the difference in level d1 of the step portion DL in the present embodiment.

In this regard, in the related technique, for example, the depth of the ditch DIT is almost the same as the difference in level of the step portion DL as shown in FIG. 3. This is because since the related technique is not based on the premise that the resin RS entering the inside of the ditch DIT is removed, the focus is placed only on improving the effect of stopping the spread of the resin leakage by increasing the internal volume of the ditch DIT as much as possible. On the other hand, since the present embodiment is based on the premise that the resin RS entering the inside of the ditch DIT1 (ditch DIT2) is removed, the depth d2 of the ditch DIT1 (ditch DIT2) is smaller than the difference in level of the step portion DL in which the removal of the embedded resin RS is not premised as shown in FIG. 8.

As the further devised point of the second feature in the present embodiment, for example, the shape of the ditch DIT1 and the shape of the ditch DIT2 are V-shape as shown in FIG. 8. In this manner, according to the present embodiment, the ease of removal of the resin RS entering the ditch DIT1 (ditch DIT2) can be improved. This is because since the V-shaped ditch DIT1 (ditch DIT2) in the present embodiment has smaller volume than the semicircular ditch DIT in the related technique shown in FIG. 3 even when the ditch DIT1 (DIT2) has the same depth and width as those of the semicircular ditch DIT, it considered that the ease of removal of the resin RS entering the ditch DIT1 (ditch DIT2) is improved.

It should be noted that a press method can be used for forming the V-shaped ditch DIT1 (ditch DIT2). Accordingly, the second feature in the present embodiment specifically has the first devised point that the depth d2 of the ditch DIT1 (ditch DIT2) is made shallower and the second devised point that the ditch DIT1 (ditch DIT2) is made to have a V-shape to reduce the volume. Thus, according to the present embodiment, the removal characteristics of the resin RS entering the ditch DIT1 (ditch DIT2) can be greatly improved by the synergy effect of the first devised point and the second devised point.

Next, the third feature in the present embodiment is that a plurality of ditches (for example, the ditch DIT1 and the ditch DIT2) are provided on the lower surface of the chip mounting portion TAB as shown in FIGS. 7 and 8. This configuration is useful because the ditch DIT1 in the present embodiment is premised to remove the resin RS entering the ditch DIT1 and the ditch DIT1 is designed in consideration of not only the function of stopping the spread of the resin leakage but also the ease of removal of the resin RS entering the inside of the ditch DIT1. Namely, in the present embodiment, the ease of removal of the resin RS entering the inside of the ditch DIT1 is taken into consideration, and the second feature described above is made from the viewpoint of improving the ease of removal of the resin RS. Further, according to the second feature in the present embodiment, the ease of removal of the resin RS entering the ditch DIT1 can be improved by the first devised point that the depth d2 of the ditch DIT1 is made shallower and the second devised point that the ditch is made to have a V-shape to reduce the volume. Meanwhile, it can be said that the fact that the ease of removal of the resin RS entering the ditch DIT1 can be improved conversely means that the function of stopping the spread with the ditch DIT1 is reduced. Therefore, in the present embodiment, in order to suppress the deterioration of the function of stopping the spread, which appears as a side effect of the configuration for improving the ease of removal of the resin RS entering the ditch DIT1, a plurality of ditches (for example, ditch DIT1 and ditch DIT2) are provided on the lower surface of the chip mounting portion TAB (third feature). In this manner, for example, the resin RS that cannot be stopped by the ditch DIT1 can be stopped by the ditch DIT2 provided on the inner side of the ditch DIT1 as shown in FIG. 18. In other words, according to the third feature in the present embodiment, the function of stopping the spread can be fully implemented by suppressing the side effect of the second feature of the decrease in the function of stopping the spread.

As described above, according to the present embodiment, the improvement in the function of stopping the spread of the resin leakage on the lower surface of the chip mounting portion TAB and the improvement in the ease of removal of the resin RS entering the inside of the ditch DIT1

(ditch DIT2) can achieved at a higher level by combining the second feature and the third feature described above.

The third feature in the present embodiment provides the useful configuration because it is based on the premise of the first feature that the resin RS entering the inside of the ditch DIT1 (ditch DIT2) is removed by cleaning the lower surface of the chip mounting portion TAB. This point will be described below.

For example, in the related technique shown in FIG. 3, the removal of the resin RS embedded in the ditch DIT is not premised. Therefore, in the related technique, it is difficult to adopt a plurality of ditches DIT arranged to be spaced apart from each other on the lower surface of the chip mounting portion TAB. This is because when a plurality of ditches DIT are provided on the lower surface of the chip mounting portion TAB in the related technique, the resin RS remains in the region up to the inner ditch DIT. In other words, when a plurality of ditches DIT are provided on the lower surface of the chip mounting portion TAB to improve the function of stopping the spread of the resin leakage in the related technique, since the resin RS leaked onto the lower surface of the chip mounting portion TAB remains as it is, the region where the resin RS remains increases. This means that the connection reliability between the semiconductor device and the mounting board is deteriorated and the heat radiation characteristics of the semiconductor device are deteriorated. Therefore, in the related technique, it is difficult to adopt the configuration in which a plurality of ditches DIT are provided on the lower surface of the chip mounting portion TAB from the viewpoint of improving the connection reliability between the semiconductor device and the mounting board and improving the heat radiation characteristics of the semiconductor device. Namely, in the related technique where the removal of the resin RS embedded in the ditch DIT is not premised, the configuration where a single ditch DIT is provided and the internal volume of the single ditch DIT is increased as much as possible to improve the effect of stopping the spread of the resin leakage is more useful than the configuration where a plurality of ditches DIT are provided on the lower surface of the chip mounting portion TAB to improve the effect of stopping the spread of the resin leakage.

On the other hand, the present embodiment is based on the premise that the lower surface of the chip mounting portion TAB is cleaned to remove the resin RS entering the inside of the ditch DIT1 (ditch DIT2). In this case, since the resin RS entering each of the ditch DIT1 and the ditch DIT2 is removed, the configuration in which a plurality of ditches DIT1 and DIT2 are provided does not cause the deterioration of the connection reliability between the semiconductor device and the mounting board and the deterioration of the heat radiation characteristics of the semiconductor device, and the function of stopping the spread of the resin leakage can be improved unlike the related technique. Meanwhile, since the configuration where a single ditch is provided and the internal volume of the single ditch is increased as much as possible to improve the effect of stopping the spread of the resin leakage significantly lowers the ease of removal of the entering resin RS in the present embodiment, it is difficult to adopt the configuration in the present embodiment. Here, the present embodiment is based on the premise that the resin RS entering the inside of the ditch DIT1 (ditch DIT2) is removed by cleaning the lower surface of the chip mounting portion TAB. Therefore, the configuration where a plurality of ditches (ditch DIT1 and ditch DIT2) are provided on the lower surface of the chip mounting portion TAB to improve the function of stopping the spread of the resin leakage is more useful in the present embodiment than the configuration where a single ditch DIT is provided on the lower surface of the chip mounting portion TAB and the internal volume of the single ditch DIT is increased as much as possible to improve the effect of stopping the spread of the resin leakage.

As described above, the present embodiment is different in the orientation (viewpoint) from the related technique. For this reason, the third feature in the present embodiment that a plurality of ditches (ditch DIT1 and ditch DIT2) spaced apart from each other are provided on the lower surface of the chip mounting portion TAB has a useful technical significance because it is based on the premise of the first feature that the lower surface of the chip mounting portion TAB is cleaned to remove the resin RS entering the inside of the ditch DIT1 (ditch DIT2).

Subsequently, the fourth feature in the present embodiment is that the devise of suppressing the entry of the resin RS as much as possible is provided at the outer peripheral portion of the lower surface of the chip mounting portion TAB. This is because if the entry of the resin RS can be suppressed at the outer peripheral portion of the lower surface of the chip mounting portion TAB as much as possible, the area where the resin RS enters can be reduced in the lower surface of the chip mounting portion TAB, so that the ease of removal of the resin RS entering the lower surface can be improved.

The specific first devised point of the fourth feature in the present embodiment is that the distance L1 between the step portion DL and the center position of the ditch DIT1 is smaller than the distance L2 between the center position of the ditch DIT1 and the center position of the ditch DIT2 in a cross-sectional view as shown in FIG. 8. This allows the arrangement position of the ditch DIT1 arranged on the outside to approach the outer peripheral portion of the chip mounting portion TAB. Namely, the area of the resin RS entering the lower surface of the chip mounting portion TAB can be reduced as the arrangement position of the ditch DIT1 arranged on the outside is closer to the outer peripheral portion of the chip mounting portion TAB. Thus, according to the fourth feature in the present embodiment, the ease of removal of the resin RS entering the lower surface of the chip mounting portion TAB can be improved.

Next, the further specific second devised point of the fourth feature in the present embodiment is that the ditch DIT1 (ditch DIT2) arranged to extend along the outer peripheral portion of the lower surface of the chip mounting portion TAB has a tapered shape near the corner portion of the chip mounting portion TAB as shown in FIG. 7. In other words, the chip mounting portion TAB has a first side extending in the first direction, a second side crossing the first side, and a corner portion which is the intersection of the first side and the second side. Further, the ditch DIT1 (ditch DIT2) includes a first portion parallel to the first side, a second portion parallel to the second side, and a third portion connecting the first portion and the second portion. Here, the distance between the third portion of the ditch DIT1 (ditch DIT2) and the corner portion is longer than the distance between the first portion of the ditch DIT1 (ditch DIT2) and the first side, and is longer than the distance between the second portion of the ditch DIT1 (ditch DIT2) and the second side. In particular, the angle formed by the third portion and the first portion is an obtuse angle, and the angle formed by the third portion and the second portion is also an obtuse angle.

Thus, according to the further specific second devised point of the fourth feature in the present embodiment, the ditch DIT1 (ditch DIT2) can be arranged as close as possible to the vicinity of the outer peripheral portion of the chip mounting portion TAB. This is because although the ditch DIT1 (ditch DIT2) must be separated from the corner portion of the chip mounting portion TAB by a certain distance due to the design layout constraint, the presence of the tapered shape makes it possible to arrange the ditch DIT1 (ditch DIT2) as close as possible to the vicinity of the outer peripheral portion of the chip mounting portion TAB while securing the distance between the corner portion and the tapered shape as compared with the case where the tapered shape is not present. As a result, according to the present embodiment, the area of resin RS entering the lower surface of the chip mounting portion TAB can be reduced, and thus the ease of removal of the resin RS entering the lower surface of the chip mounting portion TAB can be improved.

From the foregoing, according to the fourth feature in the present embodiment, the ditch DIT1 (ditch DIT2) can be arranged as close as possible to the vicinity of the outer peripheral portion of the chip mounting portion TAB by the synergy effect of the first devised point and the second devised point. As a result, the amount of the resin RS entering the lower surface of the chip mounting portion TAB can be reduced, and thus the ease of removal of the resin RS entering the lower surface of the chip mounting portion TAB can be greatly improved.

Next, the fifth feature in the present embodiment is that the difference in level d1 of the step portion DL is ½ or less of the thickness t1 of the chip mounting portion TAB as shown in FIG. 8. Here, from the viewpoint of effectively suppressing the entry of the resin RS onto the lower surface of the chip mounting portion TAB, it can be thought that it is desirable that the difference in level of the step portion DL is large. From this point, for example, it can be thought that it is desirable that the difference in level of the step portion DL is larger than ½ of the thickness of the chip mounting portion TAB as in the related technique shown in FIG. 3. However, in the present embodiment, the difference in level d1 of the step portion DL is set to ½ or less of the thickness t1 of the chip mounting portion TAB.

This is for the following reason. That is, the step portion DL is formed by, for example, a press method, and the amount of crushing increases as the difference in level of the step portion DL increases, so that the flatness of the upper surface of the chip mounting portion TAB is deteriorated. Further, the deterioration in the flatness of the upper surface of the chip mounting portion TAB leads to the deterioration in the mountability of the semiconductor chip CHP mounted on the upper surface of the chip mounting portion TAB. Therefore, in the present embodiment, the difference in level d1 of the step portion DL is set to ½ or less of the thickness t1 of the chip mounting portion TAB. In this case, since the amount of crushing when the step portion DL is formed by the press method can be reduced, the deterioration in the flatness of the upper surface of the chip mounting portion TAB can be suppressed. Therefore, according to the fifth feature in the present embodiment, the deterioration in the mountability of the semiconductor chip CHP mounted on the upper surface of the chip mounting portion TAB can be suppressed.

Further, according to the fifth feature in the present embodiment, the effect of suppressing the entry of the resin RS onto the lower surface of the chip mounting portion TAB with the single step portion DL is reduced. However, according to the present embodiment, since the ditch DIT1 is provided on the inner side of the step portion DL and the ditch DIT2 is provided on the inner side of the ditch DIT1, the entry of the resin RS onto the lower surface of the chip mounting portion TAB can be sufficiently suppressed by the combination of the step portion DL, the ditch DIT1, and the ditch DIT2. In other words, since the entry of the resin RS onto the lower surface of the chip mounting portion TAB is suppressed to a minimum by the combination of the step portion DL, the ditch DIT1, and the ditch DIT2, it is further useful to adopt the fifth feature in the present embodiment from the viewpoint of improving the flatness of the upper surface of the chip mounting portion TAB.

FIRST MODIFICATION EXAMPLE

FIG. 23(a) is an enlarged view showing a part of the chip mounting portion TAB in the first modification example. As shown in FIG. 23(a), on the lower surface of the chip mounting portion TAB in the first modification example, the step portion DL is provided at the outer end, the ditch DIT1 is formed on the inner side of the step portion DL so as to be spaced apart from the step portion DL, and the ditch DIT2 is formed on the inner side of the ditch DIT1 so as to be spaced apart from the ditch DIT1.

Here, in this first modification example, the depth of the ditch DIT1 is different from the depth of the ditch DIT2. Specifically, the depth of the ditch DIT1 is deeper than the depth of the ditch DIT2. In other words, the depth of the ditch DIT2 is shallower than the depth of the ditch DIT1. More specifically, as shown in FIG. 23(a), the relationship d1>d2a>d2b holds between the difference in level d1 of the step portion DL, the depth d2a of the ditch DIT1, and the depth d2b of the ditch DIT2.

This is for the following reason. That is, the resin is embedded in the step portion DL, and the removal of the resin embedded in the step portion DL is not premised. On the other hand, the ditch DIT1 (ditch DIT2) is premised to remove the entering resin. Accordingly, the step portion DL and the ditch DIT1 (ditch DIT2) differ as to whether to remove the resin or not, and since the resin can be more easily removed when the depth is shallower, the depth d2a of the ditch DIT1 and the depth d2b of the ditch DIT2 are smaller than the difference in level d1 of the step portion DL also in this first modification example.

Furthermore, in this first modification example, the following point is also taken into consideration. For example, when the resin RS enters the ditch DIT1 and the ditch DIT2 formed on the lower surface of the chip mounting portion TAB as shown in FIG. 18, the amount of the resin RS entering the ditch DIT1 is larger than the amount of the resin RS entering the ditch DIT2. In other words, the entry of the resin RS is first suppressed by the ditch DIT1 formed on the outside, and the resin RS that cannot be stopped by the ditch DIT1 is stopped by the ditch DIT2 formed on the inside. Accordingly, as shown in FIG. 18, the amount of the resin RS entering the ditch DIT1 is larger than the amount of the resin RS entering the ditch DIT2. Therefore, in this first modification example, the depth d2a of the ditch DIT1 is made deeper than the depth d2b of the ditch DIT2. Thus, according to this first modification example, since the depth d2a of the ditch DIT1 arranged on the outside is smaller than the difference in level d1 of the step portion DL, the ease of removal can be secured, and the function of stopping the spread is sufficiently secured by making the depth d2a of the ditch DIT1 deeper than the depth d2b of the ditch DIT2. In other words, according to this first modification example, since the ditch DIT2 arranged on the inside is not required to have the effect of stopping the spread of the resin as compared with the ditch DIT1, the ease of removal of the resin is improved by making the depth d2b of the ditch DIT2 shallower than the depth d2a of the ditch DIT1.

SECOND MODIFICATION EXAMPLE

FIG. 23(b) is an enlarged view showing a part of the chip mounting portion TAB in the second modification example. As shown in FIG. 23(b), on the lower surface of the chip mounting portion TAB in the second modification example, the step portion DL is provided at the outer end, the ditch DIT1 is formed on the inner side of the step portion DL so as to be spaced apart from the step portion DL, and the ditch DIT2 is formed on the inner side of the ditch DIT1 so as to be spaced apart from the ditch DIT1.

Here, in this second modification example, the shape of the ditch DIT1 and the shape of the ditch DIT2 are semicircular. In other words, although the example in which the ditch DIT1 and the shape of the ditch DIT2 are formed to have the V shape as shown in FIG. 8 has been described in the embodiment, the shape of the ditch DIT1 and the shape of the ditch DIT2 are not limited to this, and the ditch DIT1 and the ditch DIT2 may be formed to have a semicircular shape as in the second modification example shown in FIG. 23(b). In this case, for example, since the ditch DIT1 and ditch DIT2 can be formed by etching process, the amount of crushing as in the press method does not occur, and the advantage that the flatness of the upper surface of the chip mounting portion TAB can be easily secured can be obtained.

THIRD MODIFICATION EXAMPLE

Although the QFP has been described in the embodiment as an example of the package configuration of the semiconductor device PKG1, the technical idea in the embodiment can be applied also to a semiconductor device adopting the QFN (Quad Flat Non-Leaded Package) as the package configuration other than the semiconductor device adopting the QFP.

(Individual Molding Type)

Figure 24:
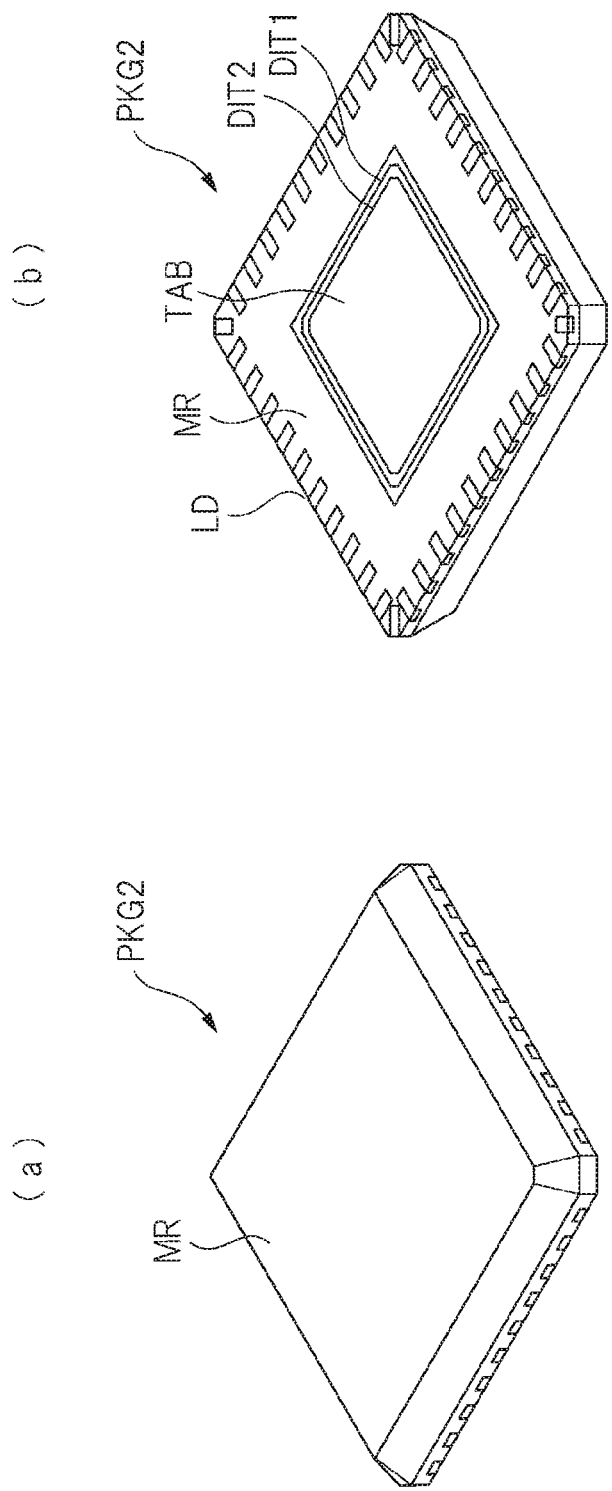
FIG. 24(a) is a perspective view of a semiconductor device (individual molding type) in a third modification example seen from the upper surface side.
FIG. 24(b) is a perspective view of the semiconductor device in the third modification example seen from the lower surface side.

FIG. 24(a) is an external view of the semiconductor device PKG2 in this third modification example viewed from the upper surface side, and FIG. 24(b) is an external view of the semiconductor device PKG2 in this third modification example viewed from the lower surface side. As shown in FIG. 24(b), a plurality of leads LD are arranged in the outer peripheral portion of the lower surface of the sealing body MR, and the lower surface of the chip mounting portion TAB is exposed from the sealing body MR in the central part of the lower surface of the sealing body MR. Further, the ditch DIT1 and the ditch DIT2 are formed on the exposed lower surface of the chip mounting portion TAB.

Figure 25:
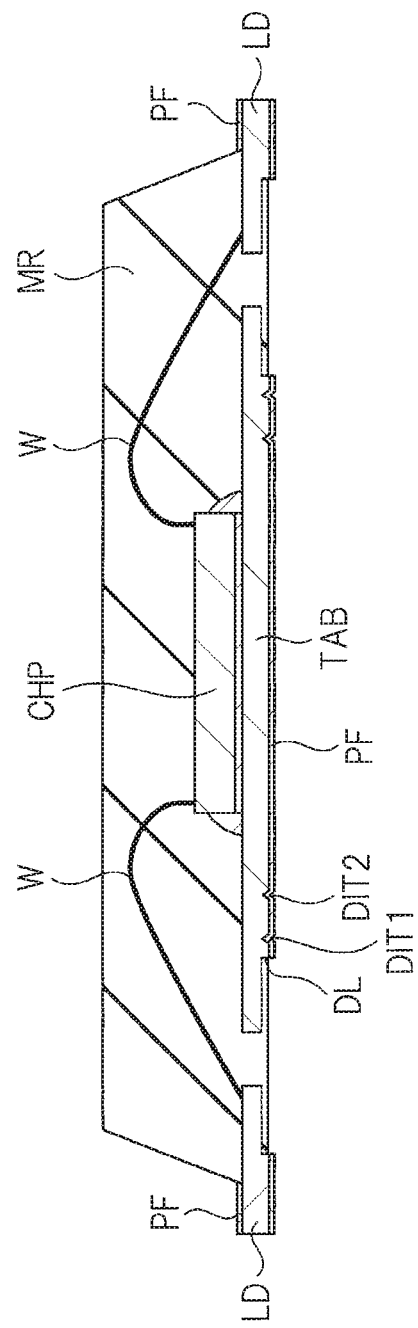
FIG. 25 is a cross-sectional view showing the semiconductor device in the third modification example.

FIG. 25 is a cross-sectional view showing the semiconductor device PKG2 in this third modification example. As shown in FIG. 25, it can be seen that the ditch DIT1 and the ditch DIT2 are formed on the lower surface of the chip mounting portion TAB exposed from the sealing body MR also in the semiconductor device PKG2 in this third modification example. In this manner, the technical idea in the embodiment can be embodied also in the semiconductor device PKG2 in this third modification example.

(Batch Molding Type)

Figure 26:
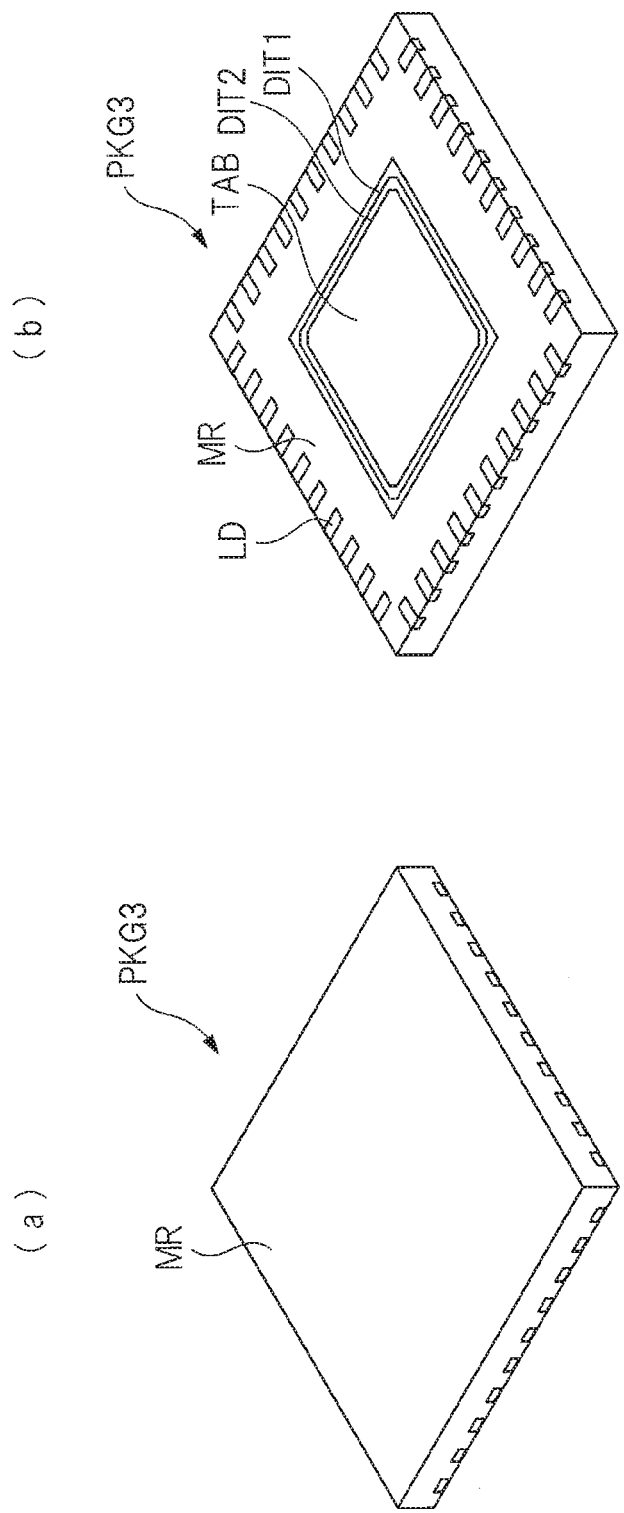
FIG. 26(a) is a perspective view of a semiconductor device (batch molding type) in the third modification example seen from the upper surface side.
FIG. 26(b) is a perspective view of the semiconductor device in the third modification example seen from the lower surface side.

FIG. 26(a) is an external view of the semiconductor device PKG3 in this third modification example viewed from the upper surface side, and FIG. 26(b) is an external view of the semiconductor device PKG3 in this third modification example viewed from the lower surface side. As shown in FIG. 26(b), a plurality of leads LD are arranged in the outer peripheral portion of the lower surface of the sealing body MR, and the lower surface of the chip mounting portion TAB is exposed from the sealing body MR in the central part of the lower surface of the sealing body MR. Further, the ditch DIT1 and the ditch DIT2 are formed on the exposed lower surface of the chip mounting portion TAB.

Figure 27:
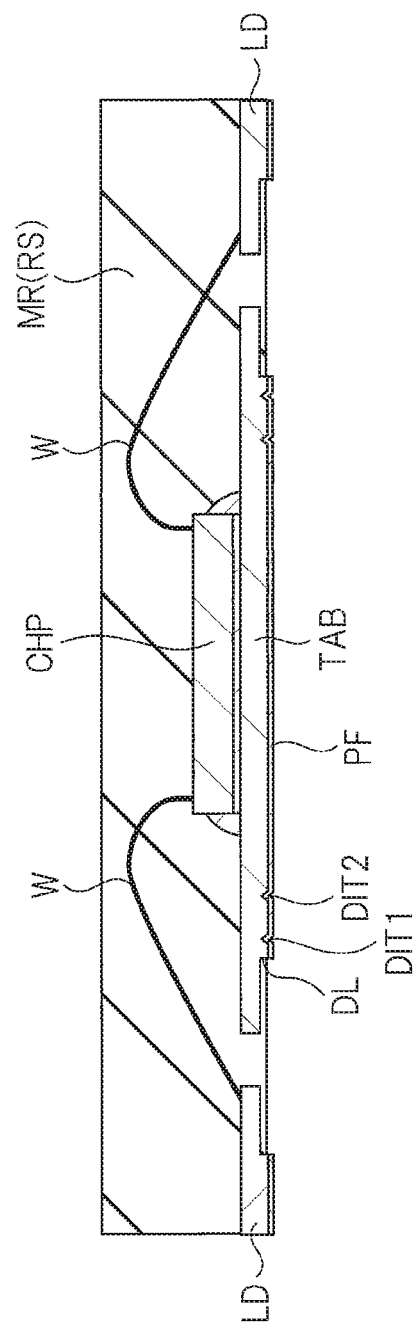
FIG. 27 is a cross-sectional view showing the semiconductor device in the third modification example.

FIG. 27 is a cross-sectional view showing the semiconductor device PKG3 in this third modification example. As shown in FIG. 27, it can be seen that the ditch DIT1 and the ditch DIT2 are formed on the lower surface of the chip mounting portion TAB exposed from the sealing body MR also in the semiconductor device PKG3 in this third modification example. In this manner, the technical idea in the embodiment can be embodied also in the semiconductor device PKG3 in this third modification example.

In the foregoing, the invention made by the inventor of the present invention has been concretely described based on the embodiments. However, it is needless to say that the present invention is not limited to the foregoing embodiments and various modifications and alterations can be made within the scope of the present invention.

The embodiment described above includes the following modes.

(Appendix 1)

A semiconductor device comprising:

a chip mounting portion having a lower surface on which a first ditch is formed;

a semiconductor chip mounted on an upper surface of the chip mounting portion;

a lead electrically connected to a pad of the semiconductor chip through a conductive member; and a sealing body configured to seal the semiconductor chip, wherein the lower surface of the chip mounting portion is exposed from the sealing body, and wherein a plating film is formed on the lower surface including an inside of the first ditch.

(Appendix 2)

The semiconductor device according to appendix 1, wherein resin constituting the sealing body is not formed inside the first ditch.

(Appendix 3)

The semiconductor device according to appendix 1, wherein the first ditch is formed along an outer peripheral portion of the chip mounting portion.

(Appendix 4)

The semiconductor device according to appendix 1, wherein a depth of the first ditch is ½ or less of a thickness of the chip mounting portion.

(Appendix 5)

The semiconductor device according to appendix 1, wherein the first ditch has a V-shaped cross section.

(Appendix 6)

The semiconductor device according to appendix 1, wherein a second ditch is further formed on the lower surface of the chip mounting portion so as to be spaced apart from the first ditch.

(Appendix 7)

The semiconductor device according to appendix 6, wherein the second ditch is formed on an inner side of the chip mounting portion relative to the first ditch.

(Appendix 8)

The semiconductor device according to appendix 6, wherein a depth of the first ditch and a depth of the second ditch are both ½ or less of a thickness of the chip mounting portion.

(Appendix 9)

The semiconductor device according to appendix 7,
wherein a depth of the first ditch is deeper than a depth of the second ditch.

(Appendix 10)

The semiconductor device according to appendix 6,
wherein the plating film is formed also on an inner wall of the second ditch.

(Appendix 11)

The semiconductor device according to appendix 6,
wherein resin constituting the sealing body is not formed inside the second ditch.

(Appendix 12)

The semiconductor device according to appendix 1,
wherein a step portion spaced apart from the first ditch is formed at an outer end of the lower surface of the chip mounting portion.

(Appendix 13)

The semiconductor device according to appendix 12,
wherein the first ditch is formed on an inner side of the step portion.

(Appendix 14)

The semiconductor device according to appendix 12,
wherein a depth of the first ditch is shallower than a difference in level of the step portion.

(Appendix 15)

The semiconductor device according to appendix 12,
wherein a second ditch is formed on an inner side of the first ditch on the lower surface of the chip mounting portion, and
a distance between the step portion and a center position of the first ditch is smaller than a distance between the center position of the first ditch and a center position of the second ditch in a cross-sectional view.

(Appendix 16)

The semiconductor device according to appendix 12,
wherein resin constituting the sealing body is formed inside the step portion.

(Appendix 17)

The semiconductor device according to appendix 1,
wherein the chip mounting portion has a first side extending in a first direction, a second side crossing the first side, and a corner portion which is an intersection of the first side and the second side,
wherein the first ditch includes a first portion parallel to the first side, a second portion parallel to the second side, and a third portion connecting the first portion and the second portion, and
wherein a distance between the third portion of the first ditch and the corner portion is longer than a distance between the first portion of the first ditch and the first side, and is longer than a distance between the second portion of the first ditch and the second side.

(Appendix 18)

The semiconductor device according to appendix 17,
wherein an angle formed by the third portion and the first portion is an obtuse angle, and
wherein an angle formed by the third portion and the second portion is an obtuse angle.

REFERENCE SIGNS LIST

CHP semiconductor chip
DIT1 ditch
DIT2 ditch
DL step portion
LD lead
LF lead frame
MR sealing body
PF plating film
RS resin
TAB chip mounting portion
W wire

The invention claimed is:

1. A manufacturing method of a semiconductor device comprising the steps of:
   (a) preparing a lead frame including a chip mounting portion having a lower surface on which a first ditch is formed and a lead;
   (b) mounting a semiconductor chip on an upper surface of the chip mounting portion;
   (c) electrically connecting a pad formed on the semiconductor chip and the lead through a conductive member;
   (d) sealing the semiconductor chip with resin while exposing a part of the lead and the lower surface of the chip mounting portion;
   (e) cleaning the lower surface of the chip mounting portion after the step (d); and
   (f) forming a plating film on the lower surface of the chip mounting portion after the step (e),
   wherein when the resin enters the first ditch formed on the lower surface of the chip mounting portion by the step (d), the resin embedded in the first ditch is removed by the step (e), and
   wherein the plating film is formed also on an inner wall of the first ditch in the step (f).

2. The manufacturing method of a semiconductor device according to claim 1,
   wherein the first ditch is formed along an outer peripheral portion of the chip mounting portion.

3. The manufacturing method of a semiconductor device according to claim 1,
   wherein a depth of the first ditch is ½ or less of a thickness of the chip mounting portion.

4. The manufacturing method of a semiconductor device according to claim 1,
   wherein the first ditch is formed by a press method.

5. The manufacturing method of a semiconductor device according to claim 1,
   wherein the first ditch has a V-shaped cross section.

6. The manufacturing method of a semiconductor device according to claim 1,
   wherein a second ditch is further formed on the lower surface of the chip mounting portion so as to be spaced apart from the first ditch.

7. The manufacturing method of a semiconductor device according to claim 6,
   wherein the second ditch is also formed along an outer peripheral portion of the chip mounting portion.

8. The manufacturing method of a semiconductor device according to claim 7,
   wherein the second ditch is formed on an inner side of the chip mounting portion relative to the first ditch.

9. The manufacturing method of a semiconductor device according to claim 6,
   wherein a depth of the first ditch and a depth of the second ditch are both ½ or less of a thickness of the chip mounting portion.

10. The manufacturing method of a semiconductor device according to claim 8,
    wherein a depth of the first ditch is deeper than a depth of the second ditch.

11. The manufacturing method of a semiconductor device according to claim 8, wherein when the resin enters the first ditch and the second ditch formed on the lower surface of the chip mounting portion by the step (d), an amount of the resin entering the first ditch is larger than an amount of the resin entering the second ditch.

12. The manufacturing method of a semiconductor device according to claim 1,
wherein a step portion spaced apart from the first ditch is formed at an outer end of the lower surface of the chip mounting portion.

13. The manufacturing method of a semiconductor device according to claim 12,
wherein the first ditch is formed on an inner side of the step portion.

14. The manufacturing method of a semiconductor device according to claim 12,
wherein a depth of the first ditch is shallower than a difference in level of the step portion.

15. The manufacturing method of a semiconductor device according to claim 12,
wherein a second ditch is formed on an inner side of the first ditch on the lower surface of the chip mounting portion, and
wherein a distance between the step portion and a center position of the first ditch is smaller than a distance between the center position of the first ditch and a center position of the second ditch in a cross-sectional view.

* * * * *